US012682940B2

(12) United States Patent　　　　　　　　(10) Patent No.:　US 12,682,940 B2

Lee et al.　　　　　　　　　　　　　　　　(45) Date of Patent:　Jul. 14, 2026

(54) MEMORY DEVICES INCLUDING FERROELECTRIC CELL CAPACITORS AND OPERATING METHODS THEREOF

(71) Applicant: Samsung Electronics Co., Ltd., Suwon-si (KR)

(72) Inventors: Hwayeong Lee, Suwon-si (KR); Seulji Song, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 93 days.

(21) Appl. No.: 18/797,698

(22) Filed: Aug. 8, 2024

(65) Prior Publication Data

US 2025/0054532 A1　　　Feb. 13, 2025

(30) Foreign Application Priority Data

Aug. 9, 2023　　(KR) .......................... 10-2023-0104366

(51) Int. Cl.
G11C 11/22　　　　　(2006.01)

(52) U.S. Cl.
CPC ...... G11C 11/2275 (2013.01); G11C 11/2255 (2013.01); G11C 11/2273 (2013.01)

(58) Field of Classification Search
CPC .............. G11C 11/221; G11C 11/2255; G11C 11/2257; G11C 11/2259; G11C 11/2273; G11C 11/2275; G11C 11/2293
See application file for complete search history.

(56) References Cited

U.S. PATENT DOCUMENTS

| | | | |
|---|---|---|---|
| 6,704,218 B2 | 3/2004 | Rickes et al. | |
| 7,142,444 B2 | 11/2006 | Nishihara et al. | |
| 7,170,770 B2 | 1/2007 | Kang | |
| 10,825,834 B1 | 11/2020 | Chen | |
| 11,501,814 B2 | 11/2022 | Fackenthal | |
| 2003/0076704 A1* | 4/2003 | Ashikaga | G11C 11/22 365/145 |
| 2010/0182821 A1 | 7/2010 | Muraoka et al. | |

(Continued)

FOREIGN PATENT DOCUMENTS

| | | |
|---|---|---|
| KR | 20030079739 A | 10/2003 |
| KR | 20040084696 A | 10/2004 |
| KR | 100626912 B1 | 9/2006 |

OTHER PUBLICATIONS

Sheikholeslami et al. "A Survey of Circuit Innovations in Ferroelectric Random-Access Memories" Proceedings of the IEEE 88(5):667-689 (May 2000).

*Primary Examiner* — Yong J Choe

(74) *Attorney, Agent, or Firm* — Wolf, Greenfield & Sacks, P.C.

(57)　　　　　　　ABSTRACT

A memory device including a ferroelectric cell capacitor, and an operating method thereof. For example, an operating method of a memory device, according to some embodiments, may include pre-charging a bit line to a pre-charge voltage, the bit line connected to a ferroelectric cell capacitor to be written to, writing data into the ferroelectric cell capacitor by adjusting a level of a voltage applied to a bit line and a word line corresponding to the ferroelectric cell capacitor, and deactivating the word line, wherein a voltage applied to a plate line connected to the ferroelectric cell capacitor is maintained at a ground voltage during the writing of the data into the ferroelectric cell capacitor.

20 Claims, 17 Drawing Sheets

100

(56) References Cited

U.S. PATENT DOCUMENTS

| 2011/0114736 A1 | | 5/2011 | Kang et al. | |
| 2012/0170348 A1 | * | 7/2012 | Clinton | G11C 11/2275 |
| | | | | 365/145 |
| 2012/0170349 A1 | * | 7/2012 | Clinton | G11C 11/2253 |
| | | | | 365/145 |
| 2021/0020220 A1 | * | 1/2021 | Di Vincenzo | G11C 11/2293 |
| 2024/0144987 A1 | * | 5/2024 | Park | G11C 11/2295 |

* cited by examiner

MEMORY DEVICES INCLUDING FERROELECTRIC CELL CAPACITORS AND OPERATING METHODS THEREOF

CROSS-REFERENCE TO RELATED APPLICATION

This application is based on and claims priority under 35 U.S.C. § 119 to Korean Patent Application No. 10-2023-0104366, filed on Aug. 9, 2023, in the Korean Intellectual Property Office, the disclosure of which is incorporated by reference herein in its entirety.

BACKGROUND

The inventive concept relates to a memory device, and more particularly, to a memory device including a ferroelectric cell capacitor and an operating method thereof.

As electronic products have recently become faster and consume less power, fast read/write operations and low operating voltages have become increasingly demanded for semiconductor devices that are embedded in electronic products. In response to these demands, research is being conducted on ferroelectric memory, which has ferroelectricity in which internal electric dipole moments are aligned and maintain spontaneous polarization even when an electric field is not applied to the ferroelectric memory from the outside. In particular, highly-integrated ferroelectric memory is emerging as next-generation memory because highly-integrated ferroelectric memory may enable high-speed read and write operations and is non-volatile.

SUMMARY

The present disclosure provides memory devices including a ferroelectric cell capacitor that performs a write or read operation by adjusting a voltage applied to a word line and a bit line without applying a voltage to a plate line (e.g., a ground voltage), and an operating method thereof.

According to some aspects of the inventive concepts, there is provided an operating method of a memory device, the method including pre-charging a bit line to a pre-charge voltage, the bit line connected to a ferroelectric cell capacitor to be written, writing data into the ferroelectric cell capacitor by adjusting a level of a voltage applied to the bit line and a word line corresponding to the ferroelectric cell capacitor, and deactivating the word line, wherein a voltage applied to a plate line connected to the ferroelectric cell capacitor is maintained at a ground voltage during the writing of the data into the ferroelectric cell capacitor.

According to some aspects of the inventive concepts, there is provided an operating method of a memory device, the method including pre-charging a bit line to a pre-charge voltage, the bit line connected to a ferroelectric cell capacitor to be read, reading data stored in the ferroelectric cell capacitor by performing a charge sharing operation, rewriting the data into the ferroelectric cell capacitor by adjusting a level of a voltage applied to the bit line, and deactivating a word line corresponding to the ferroelectric cell capacitor, wherein a voltage applied to a plate line connected to the ferroelectric cell capacitor is maintained at a ground voltage during the reading of the data stored in the ferroelectric cell capacitor.

According to some aspects of the inventive concepts, there is provided a memory device including a memory cell array including a first layer including a plurality of first ferroelectric cell capacitors and a second layer including a plurality of second ferroelectric cell capacitors, a first bit line decoder connected to the first layer, a second bit line decoder connected to the second layer, a common plate line connected to the first layer and the second layer, and a word line decoder connected to the first layer and the second layer, wherein the memory device is configured to apply a voltage to the common plate line that is maintained at a ground voltage when a write operation or a read operation is performed on the memory cell array.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, some embodiments of the present inventive concepts will be described in greater detail with reference to the attached drawings.

Figure 1:
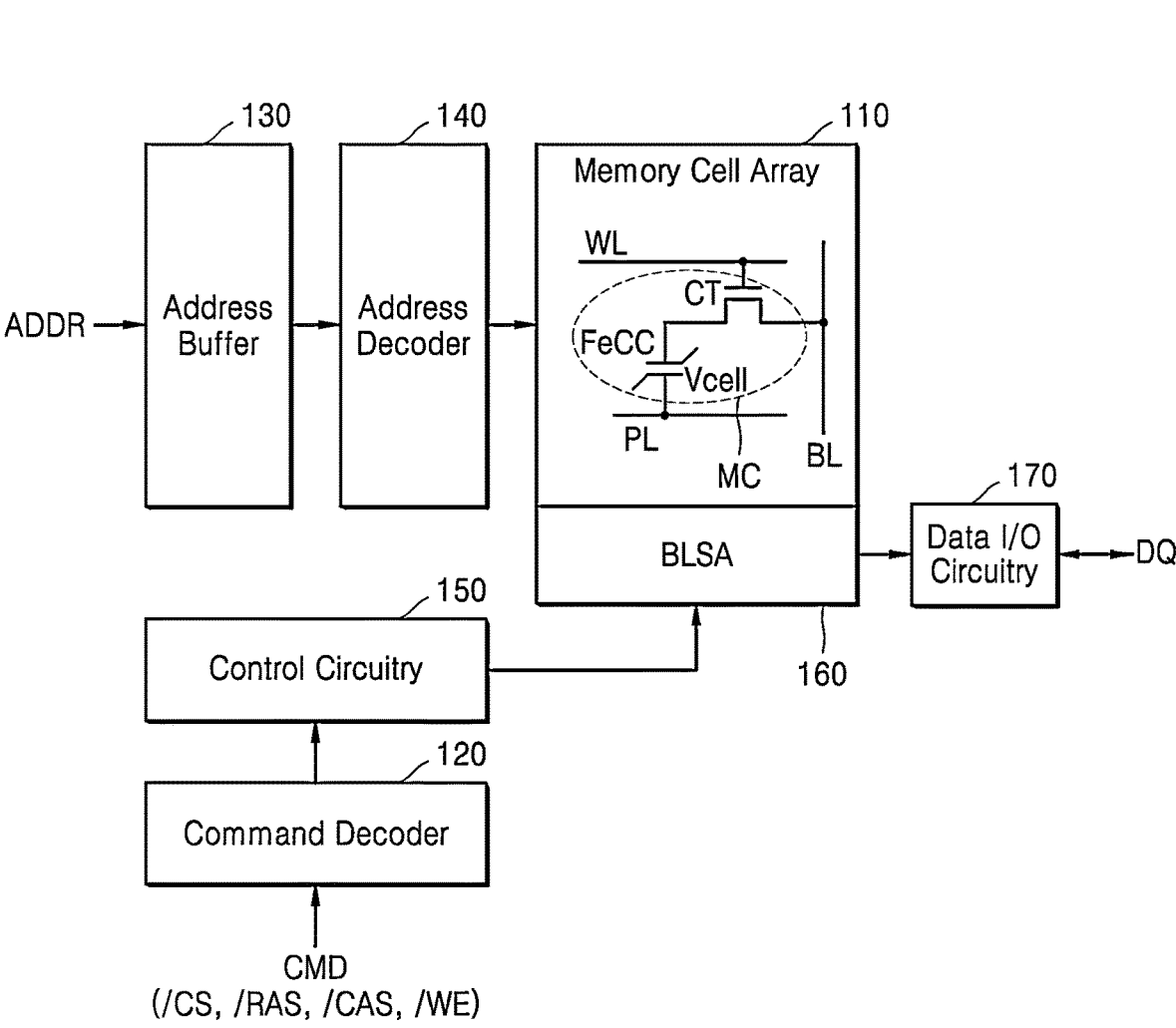
FIG. 1 is a block diagram of a memory device according to some embodiments.

FIG. 1 is a block diagram of a memory device according to some embodiments.

Referring to FIG. 1, a memory device 100 according to some embodiments may include a memory cell array 110, a command decoder 120, an address buffer 130, an address decoder 140, control circuitry 150, a bit line sense amplifier (BLSA) 160, and data I/O circuitry 170.

The memory device 100 may be or may include a ferroelectric random access memory (FeRAM) that may be configured to sense a cell voltage Vcell stored in a memory cell MC as data. The FeRAM may also be referred to as a FRAM.

The memory device 100 may input and output data DQ in response to a command CMD and an address ADDR that are received from an external device (e.g., a central processing unit (CPU) or a memory controller). The external device is not shown in FIG. 1.

The memory cell array 110 may include a plurality of memory cells MCs. The memory cell array 110 may include a plurality of word lines WLs, a plurality of bit lines BLs, and a plurality of plate lines PLs connected to the memory cells MCs.

Each of the memory cells MCs may include a cell transistor CT and a ferroelectric cell capacitor FeCC. A gate (e.g., a gate end) of the cell transistor CT may be connected to one of the word lines WLs of the memory cell array 110. A first end of the cell transistor CT may be connected to one of the bit lines BLs of the memory cell array 110. A second end of the cell transistor CT may be connected to a first end of the ferroelectric cell capacitor FeCC. A second end of the ferroelectric cell capacitor FeCC may be connected to one of the plate lines PLs of the memory cell array 110. The ferroelectric cell capacitor FeCC may store charges with a capacity corresponding to data. The ferroelectric cell capacitor FeCC is described in greater detail with reference to FIG. 2.

The memory cell MC may store a cell voltage Vcell having a magnitude for specifying data in the ferroelectric cell capacitor FeCC. According to some embodiments, the memory cell MC may store multi-bit data that includes 2 bits or more.

The command decoder 120 may determine a command CMD to be input with reference to a chip select signal /CS, a row address strobe signal /RAS, a column address strobe signal /CAS, a write enable signal /WE, or the like that are applied from the external device. The command decoder 120 may generate control signals corresponding to the command CMD. The command CMD may include an active command, a read command, a write command, a pre-charge command, or the like.

The address buffer 130 may receive an address ADDR that is applied from an external device. The address ADDR includes a word line address addressing some of the word lines WLs connected to the memory cell array 110, a bit line address addressing some of the bit lines BLs connected to the memory cell array 110, and a plate address addressing some of the plate lines PLs connected to the memory cell array 110. The address buffer 130 may transmit each of the word line address, the bit line address, and the plate line address to the address decoder 140.

The address decoder 140 may include a word line decoder, a bit line decoder, and a plate line decoder, and may be configured to select the word line WL, the bit line BL, and the plate line PL of the memory cell MC to be accessed in response to the received address ADDR.

The word line decoder may decode the word line address and may activate the word line WL of the memory cell MC corresponding to the decoded word line address. The bit line decoder may decode the bit line address and may provide a bit line select signal BLS that selects the bit line BL of the memory cell MC corresponding to the decoded bit line address. The plate line decoder may decode the plate line address and may provide a plate line select signal PLS that selects the plate line PL of the memory cell MC corresponding to the decoded plate line address.

According to some of the inventive concepts, the memory device 100 may perform a write or read operation using only the word line decoder and the bit line decoder (that is, without using the plate line decoder) by adjusting the output voltage of the bit line decoder during the write or read operation of the memory device 100. That is, in some embodiments of the present disclosure the address decoder 140 may include the word line decoder and the bit line decoder without the plate line decoder. In some embodiments, the address decoder 140 may be configured to use the word line decoder and the bit line decoder without using the plate line decoder, if present. The write or read operation of the memory device 100 related thereto is described in greater detail with reference to the other drawings.

The control circuitry 150 may control the BLSA 160 according to the control of the command decoder 120. The control circuitry 150 may control an operation of sensing the cell voltage Vcell of the memory cell MC of the BLSA 160. The control circuitry 150 may control the BLSA 160 to perform a pre-charge operation, a charge sharing operation, and a sense operation, and the like.

According to some embodiments, the memory device 100 may adjust the level of the voltage applied to the selected word line WL or the selected bit line BL without changing the level of the voltage applied to the selected plate line PL by adjusting the output voltage of each of the bit line decoder and the word line decoder, included in the address decoder 140. In addition, as the level of the voltage applied to the selected word line WL or the selected bit line BL is only adjusted without changing the level of the voltage applied to the selected plate line PL, the memory device 100 may perform a write or read operation on the memory cell MC included in the memory cell array 110. The write or read operation of the memory device 100 related thereto is described in detail with reference to the other drawings.

The BLSA 160 may sense the charge stored in the memory cell MC as data. In addition, the BLSA 160 may transmit the sensed data to the data I/O circuitry 170 so that the sensed data is output to the outside of the memory device 100 through data DQ pad(s).

The data I/O circuitry 170 may receive data DQ to be written into the memory cells MCs from outside the memory device 100 (e.g., from the external device) and may transmit the data DQ to the memory cell array 110. The data I/O circuitry 170 may output bit data sensed as read data by the BLSA 160 to outside the memory device 100 through the data DQ pad(s) (e.g., to the external device).

Figure 2:
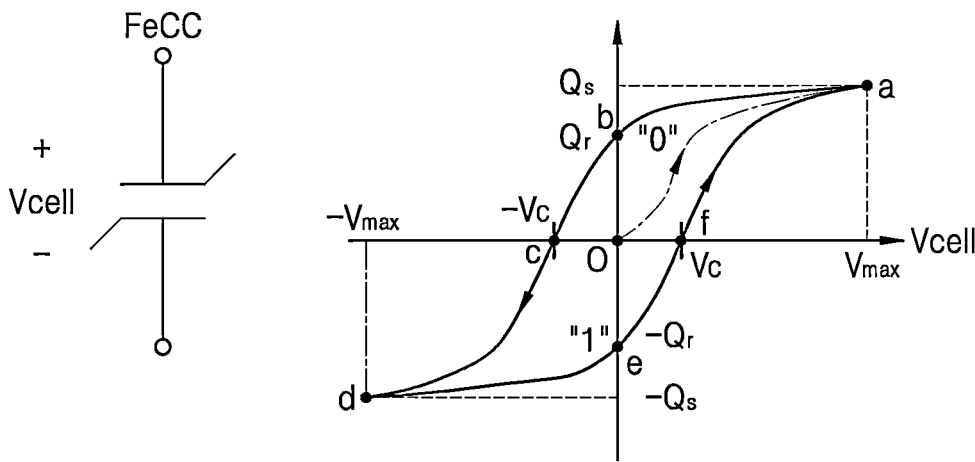
FIG. 2 is a diagram for explaining a ferroelectric cell capacitor according to some embodiments.

FIG. 2 is a diagram for explaining a ferroelectric cell capacitor FeCC according to an embodiment.

The ferroelectric cell capacitor FeCC may include a material having ferroelectricity. For example, the ferroelectric cell capacitor FeCC y may include one of PZT (lead zirconante titanate), SBT (strontium bismuth tantalate), and BLT (lanthanum-substituted bismuth titanate). In addition, the ferroelectric cell capacitor FeCC may include, for example, at least one of hafnium oxide, hafnium zirconium oxide, zirconium oxide, barium strontium titanium oxide, barium titanium oxide, and/or lead zirconium titanium oxide. Hafnium zirconium oxide may be a material in which hafnium oxide is doped with zirconium (Zr), or a compound of hafnium (Hf), zirconium (Zr), and oxygen (O). The ferroelectric cell capacitor FeCC may further include a doping element doped into the material described above. The doping element may be an element selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn).

FIG. 2 shows the hysteresis loop characteristic of the ferroelectric cell capacitor FeCC. In FIG. 2, Qr represents a remnant charge, Qs represents a saturation charge, and Vc represents a coercive voltage. The coercive voltage refers to the magnitude of a voltage that causes a total charge C of the ferroelectric cell capacitor FeCC to be 0 C, and the remnant charge and the saturation charge are described below.

Referring to FIG. 2, point O, which is an initial state in which the cell voltage Vcell is 0 V, is shown.

When the level of the cell voltage Vcell applied to the ferroelectric cell capacitor FeCC gradually increases from 0 V, polarization may occur in the ferroelectric cell capacitor FeCC so that the total charge in the ferroelectric cell capacitor FeCC may increase to Qs (point a), as shown by a dashed line in FIG. 2. A state of point a in which the voltage level applied to the ferroelectric cell capacitor FeCC is greater than a first voltage level may be referred to as a saturation polarization state of the ferroelectric cell capacitor FeCC. The level of the first voltage may be Vmax.

In the saturation polarization state, by reducing the level of voltage applied to the ferroelectric cell capacitor FeCC, the charge Q of the ferroelectric cell capacitor FeCC may be decreased along an upper solid line rather than following the dashed line backwards (point a to point b). Although the level of the voltage applied to the ferroelectric cell capacitor FeCC is 0 V at point b shown in FIG. 2, the total charge in the ferroelectric cell capacitor FeCC has a finite value, Qs, rather than 0 C, wherein Qs may be referred to as the remnant charge.

At point b, when a voltage with a negative voltage level (e.g., a reverse voltage) is applied to the ferroelectric cell capacitor FeCC to gradually increase the magnitude of the reverse voltage, polarization in the opposite direction occurs past point c, where the total charge C becomes 0 C, and saturation occurs at point d.

At point d, when the magnitude of the reverse voltage applied to the ferroelectric cell capacitor FeCC is decreased and the magnitude of the forward voltage is increased through point e, the total charge C of the ferroelectric cell capacitor FeCC may move along the solid line (solid line defa) connecting points d, e, f, and a.

That is, the total charge C of the ferroelectric cell capacitor FeCC corresponding to the level of the voltage applied to one ferroelectric cell capacitance FeCC may correspond to two (solid line abed and solid line defa). This change in value depending on the history of the process may be referred to as the hysteresis loop characteristic.

Hereinafter, when the level of the voltage applied to the ferroelectric cell capacitor FeCC is 0 V, the total charge C of the ferroelectric cell capacitor FeCC is assumed to be one of Qr representing data "0" and –Qr representing data "1". That is, hereinafter, it is assumed that the ferroelectric cell capacitor FeCC is in a stable state.

According to some embodiments, the total charge C of the ferroelectric cell capacitor FeCC may correspond to data "1" when it is –Qr, and the total charge C of the ferroelectric cell capacitor FeCC may correspond to data "0" when it is Qr, but the total charge C thereof and the present disclosure are not limited thereto.

Figure 3:
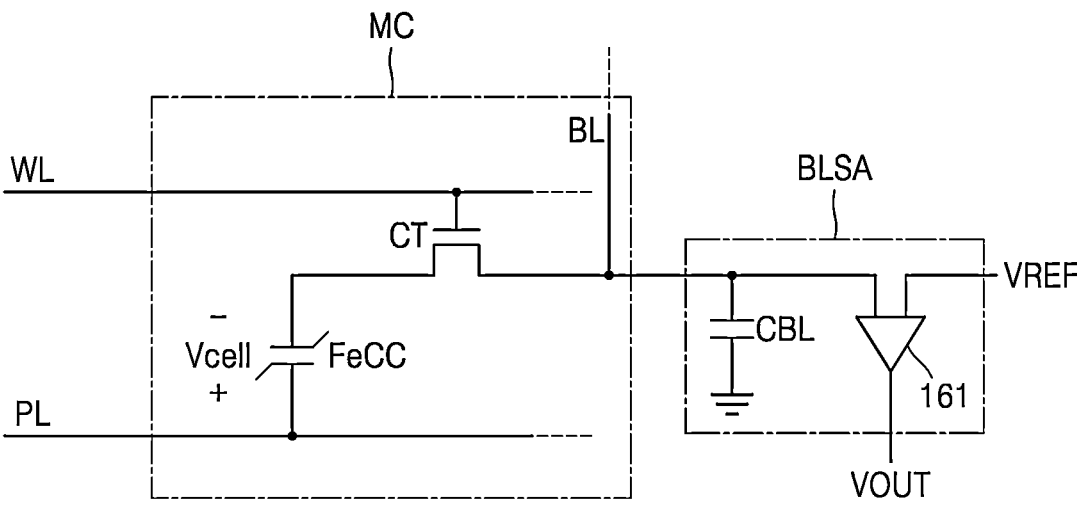
FIG. 3 is a diagram of a memory cell and a bit line sense amplifier according to some embodiments.
Figure 4:
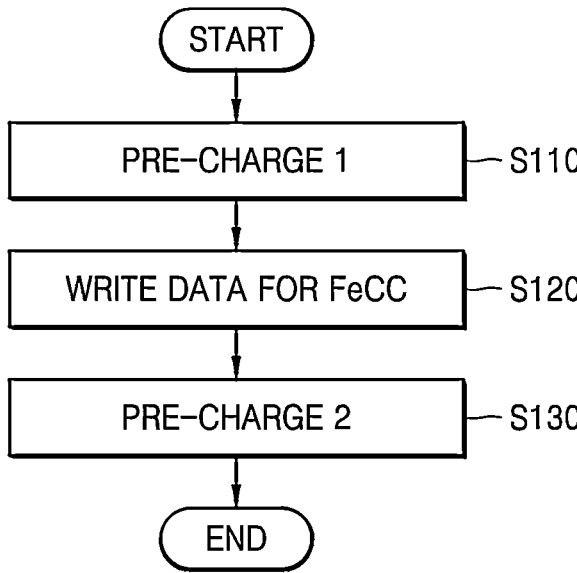
FIG. 4 is a flowchart of a write operation of a memory device according to some embodiments.
Figure 5:
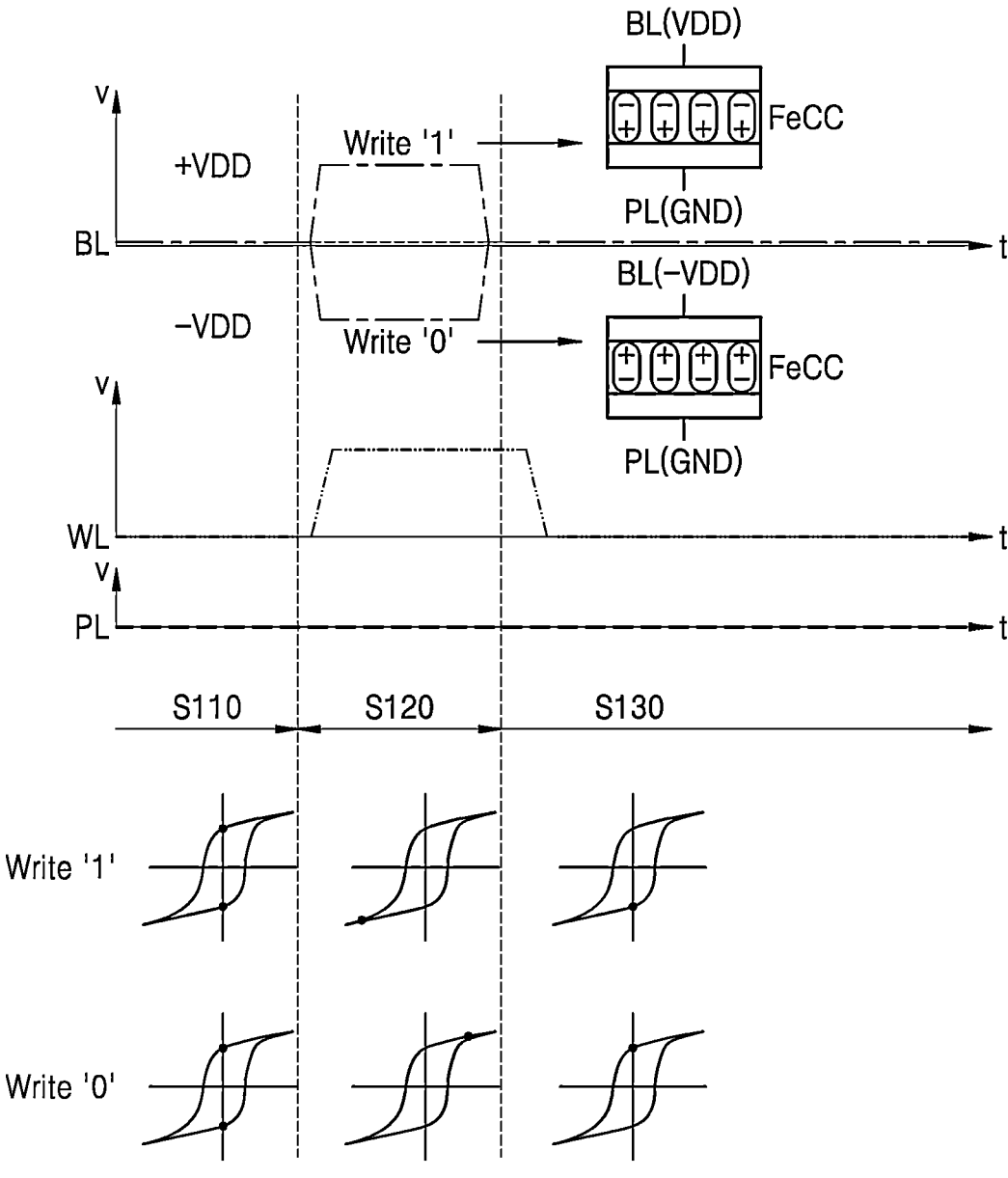
FIG. 5 is a diagram for explaining a write operation of a memory device according to some embodiments.
Figure 6:
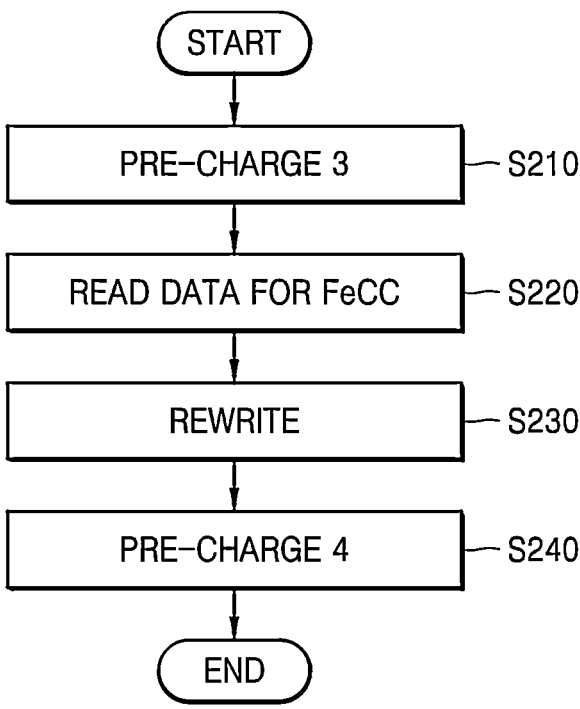
FIG. 6 is a flowchart of a read operation of a memory device according to some embodiments.
Figure 7:
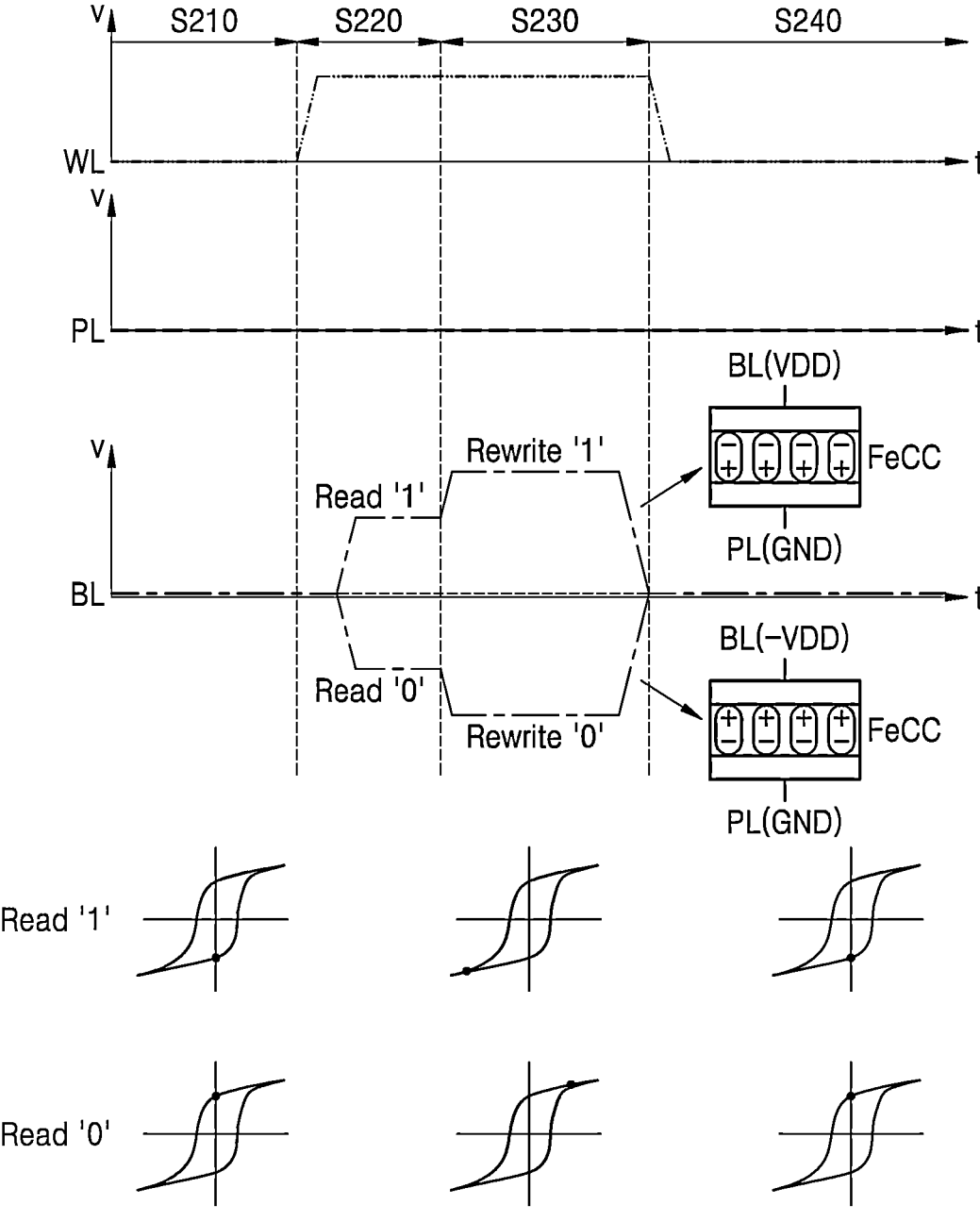
FIG. 7 is a diagram for explaining a read operation of a memory device according to some embodiments.
Figure 8:
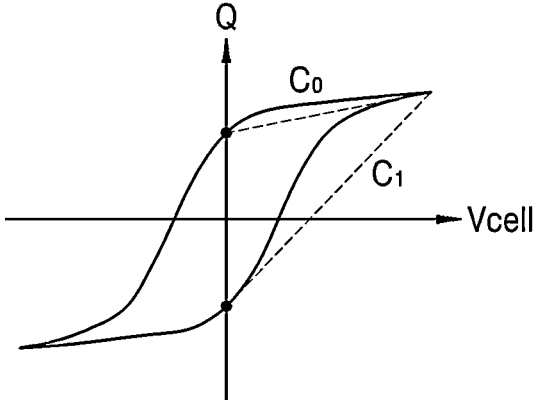
FIG. 8 is a diagram for explaining a read operation of a memory device according to some embodiments.

FIG. 3 is a diagram of a memory cell MC and a bit line sense amplifier BLSA according to some embodiments. FIG. 4 is a flowchart of a write operation of a memory device according to some embodiments. FIG. 5 is a diagram for explaining a write operation of a memory device according to some embodiments. FIG. 6 is a flowchart of a read operation of a memory device according to some embodiments. FIGS. 7 and 8 are diagrams for explaining a read operation of a memory device according to some embodiments.

Referring to FIG. 3, it may be seen that one of the plurality of memory cells MC and the bit line sense amplifier BLSA connected to the memory cell MC illustrated in FIG. 1 are shown. The configuration of the memory cell MC is described with reference to FIG. 1, so some redundant information is omitted here in the interest of brevity.

The bit line sense amplifier BLSA may include bit line sense amplifier circuitry 161. In FIG. 3, for convenience of description, an equivalent circuit (BLSA in FIG. 3) of the bit line sense amplifier is shown as including the bit line sense amplifier circuitry 161 and a parasitic capacitor CBL having a total parasitic capacitance of the bit line BL connected to the memory cell MC.

When the memory device 100 performs the read operation, the bit line sense amplifier circuitry 161 may compare a level of a reference voltage VREF with a level of a voltage applied to the parasitic capacitor CBL and may output an output voltage VOUT corresponding to the data stored in the memory cell MC.

In some embodiments, when the level of the voltage applied to the parasitic capacitor CBL is greater than that of the reference voltage VREF, the bit line sense amplifier circuitry 161 may output a first output voltage VOUT 1 corresponding to "1", which is the data stored in the memory cell MC. In addition, when the level of the voltage applied to the parasitic capacitor CBL is lower than that of the reference voltage VREF, the bit line sense amplifier circuitry 161 may output a second output voltage VOUT 0 corresponding to "0", which is the data stored in the memory cell MC. The magnitude of the first output voltage VOUT 1 may be greater than the magnitude of the second output voltage VOUT 0. However, according to some embodiments, the magnitude of the first output voltage VOUT 1 may be smaller than that of the second output voltage VOUT 0, without being limited thereto.

An operation of the memory device 100 to write data stored in one memory cell MC is described with reference to FIGS. 4 and 5. Referring to FIG. 4, in operation S110, the memory device 100 (e.g., the bit line sense amplifier BLSA) may perform a first pre-charge operation (pre-charge 1). The bit line sense amplifier BLSA may pre-charge the bit line BL connected to the ferroelectric memory cell FeCC to be written to a pre-charge voltage VPRE. The level of the pre-charge voltage VPRE may be 0 V. Since the word line WL and the plate line PL are in a deactivated state, the word line WL and the plate line PL may have a ground voltage level. The level of a ground voltage GND may be 0 V.

Referring to the upper part of FIG. 5, the level of the voltage applied to the bit line BL, the word line WL and the plate line PL, each connected to the memory cell MC, is shown over time.

Referring to the upper part of FIG. 5, it may be seen that in operation S110, the bit line BL is pre-charged to 0 V, which is the pre-charge voltage VPRE, and since the word line WL and plate line PL are in a deactivated state, the ground voltage of 0 V is applied thereto.

In addition, referring to the lower part of FIG. 5, the hysteresis loop characteristic of the ferroelectric cell capacitor FeCC included in the memory cell MC is shown.

The initial state of the ferroelectric cell capacitor FeCC before the write operation is performed does not affect subsequent states of the ferroelectric cell capacitor FeCC after the write operation is performed. Therefore, in operation S110 at the lower part of FIG. 5, point b corresponding to data "0" described with reference to FIG. 2 or point e corresponding to data "1" described with reference to FIG. 2 is shown.

Referring to FIG. 4, in operation S120, the memory device 100 may perform an operation of writing data into the memory cell MC including the ferroelectric cell capacitor FeCC.

The memory device 100 may activate the word line WL connected to the memory cell MC where data is to be written.

In some embodiments, the memory device 100 may apply a first driving voltage to the word line WL connected to the memory cell MC where data is to be written. For example, the level of the first driving voltage may be VDD+VT when writing data "1" and may be −VDD+VT when writing data "0". VDD may be a second driving voltage applied to the bit line BL to write the data "1" into the memory cell MC, and −VDD may be a third driving voltage applied to the bit line BL to write the data "0" into the memory cell MC. In addition, VT may be a threshold voltage of the cell transistor CT.

Hereinafter, a case of writing data "1" into the memory cell MC is described first.

When the data "1" is written into the memory cell MC including the ferroelectric cell capacitor FeCC, the memory device 100 may apply the second driving voltage VDD to the bit line BL connected to the memory cell MC. In addition, the memory device 100 may apply the ground voltage GND to the plate line PL connected to the memory cell MC.

The first driving voltage VDD+VT and the second driving voltage VDD, respectively applied to the word line WL and the bit line BL, may be applied in the form of pulses.

Referring to the upper part of FIG. 5, in operation S120, the level of the voltage applied to the bit line BL may be increased from the pre-charge voltage VPRE (e.g., 0 V in FIG. 5) to the second driving voltage VDD, maintained for a certain period of time, and then decreased back to the pre-charge voltage VPRE (e.g., 0 V in FIG. 5).

In addition, referring to the upper part of FIG. 5, in operations S120 and S130, the level of the voltage applied to the word line WL may be increased from the ground voltage GND (0 V in FIG. 5) to the first driving voltage (e.g., VDD+VT), maintained for a certain period of time, and then decreased to the ground voltage GND (0 V in FIG. 5). In operation S120, the word line WL may continue to be activated after being activated.

In addition, referring to the upper part of FIG. 5, in operation S120, the ground voltage GND (0 V in FIG. 5) may be continuously applied to the plate line PL after operation S110.

As a result, in operation S120, the second driving voltage VDD may be applied to the upper part of the memory cell MC including the ferroelectric cell capacitor FeCC, and the ground voltage GND may be applied to the lower part of the memory cell MC including the ferroelectric cell capacitor FeCC. As shown in FIG. 3, the cell voltage Vcell may have the −VDD level according to a voltage convention based on a node where a lower part of the ferroelectric cell capacitor FeCC and the plate line PL are connected. It is assumed that the magnitude of VDD is greater than that of Vmax described with reference to FIG. 2.

Referring to the hysteresis loop characteristic of the ferroelectric cell capacitor FeCC included in the memory cell MC in the lower part of FIG. 5, the state of the ferroelectric cell capacitor FeCC may be point d described with reference to FIG. 2 because the cell voltage Vcell has the −VDD level. As described above, regardless of the initial state of the ferroelectric cell capacitor FeCC before the write operation is performed, the state of the ferroelectric cell capacitor FeCC in operation S120 may be point d described with reference to FIG. 2.

Referring to FIG. 4, in operation S130, the memory device 100 (e.g., the bit line sense amplifier BLSA) may perform a second pre-charge operation (pre-charge 2).

The memory device 100 may deactivate the word line WL connected to the memory cell MC where data has been written.

In some embodiments, in operation S130, the memory device 100 may apply the ground voltage GND to the word line WL connected to the memory cell MC where data is to be written. Since the level of the voltage applied to the gate end of the cell transistor CT is lower than the level of the threshold voltage, the word line WL connected to the memory cell MC may be deactivated.

Referring to the upper part of FIG. 5, in operation S130, the level of the voltage applied to the bit line BL may be the pre-charge voltage VPRE (e.g., 0 V in FIG. 5).

In addition, referring to the upper part of FIG. 5, in operation S130, the level of the voltage applied to the word line WL may decrease from the first driving voltage (e.g., VDD+VT) to the ground voltage GND (0 V in FIG. 5). In operation S130, the word line WL may be deactivated.

In addition, referring to the upper part of FIG. 5, in operation S130, the ground voltage GND (0 V in FIG. 5) may be continuously applied to the plate line PL after S110 and S120.

Due to the characteristics of the ferroelectric cell capacitor FeCC, the cell voltage Vcell exists although the level of the external voltage is 0 V. Thus, in operation S130, when the ground voltage GND is applied to the lower part of the memory cell MC including the ferroelectric cell capacitor FeCC, the cell voltage Vcell 1 corresponding to data "1" may be applied to the upper part of the memory cell MC including the ferroelectric cell capacitor FeCC.

Referring to the hysteresis loop characteristic of the ferroelectric cell capacitor FeCC included in the memory cell MC in the lower part of FIG. 5, since the cell voltage Vcell has a cell voltage level corresponding to data "1", the state of the ferroelectric cell capacitor FeCC may be point e described with reference to FIG. 2.

Hereinafter, a case of writing data "0" into the memory cell MC is described.

After operation S110, in operation S120, when the data "0" is written into the memory cell MC including the ferroelectric cell capacitor FeCC, the memory device 100 may apply the third driving voltage −VDD to the bit line BL connected to the memory cell MC. In addition, the memory device 100 may apply the ground voltage GND to the plate line PL connected to the memory cell MC.

The second driving voltage +VDD applied to the bit line BL when the data "1" is written and the third driving voltage −VDD applied to the bit line BL when the data "0" is written may have the same voltage magnitude but have opposite voltage directions. That is, the third driving voltage −VDD may be a reverse voltage −VDD of the second driving voltage VDD, which has the same magnitude as the second drive voltage VDD.

The first driving voltage (e.g., −VDD+VT) and the third driving voltage-VDD applied to the word line WL and the bit line BL may be applied in the form of pulses.

Referring to the upper part of FIG. 5, in operation S120, the level of the voltage applied to the bit line BL may be decreased from the pre-charge voltage VPRE (e.g., 0 V in FIG. 5) to the third driving voltage −VDD, maintained for a certain period of time, and then increased back to the pre-charge voltage VPRE (e.g., 0 V in FIG. 5).

In addition, referring to the upper part of FIG. 5, in operations S120 and S130, the level of the voltage applied to the word line WL may be increased from the ground voltage GND (0 V in FIG. 5) to the first driving voltage (e.g., −VDD+VT), maintained for a certain period of time, and then decreased to the ground voltage GND (0 V in FIG. 5). In operation S120, the word line WL may continue to be activated after being activated.

In addition, referring to the upper part of FIG. 5, in operation S120, the ground voltage GND (0 V in FIG. 5) may be continuously applied to the plate line PL after operation S110.

As a result, in operation S120, the third driving voltage −VDD may be applied to the upper part of the memory cell MC including the ferroelectric cell capacitor FeCC, and the ground voltage GND may be applied to the lower part of the memory cell MC including the ferroelectric cell capacitor FeCC. As shown in FIG. 3, the cell voltage Vcell may have the +VDD level according to the voltage convention based on the node where the lower part of the ferroelectric cell capacitor FeCC and the plate line PL are connected. It is assumed that the magnitude of VDD is greater than that of Vmax described with reference to FIG. 2.

Referring to the hysteresis loop characteristic of the ferroelectric cell capacitor FeCC included in the memory cell MC in the lower part of FIG. 5, the state of the ferroelectric cell capacitor FeCC may be point a described with reference to FIG. 2 because the cell voltage Vcell has the +VDD level. As described above, regardless of the initial state of the ferroelectric cell capacitor FeCC before the write operation is performed, the state of the ferroelectric cell capacitor FeCC in operation S120 may be point a described with reference to FIG. 2.

Referring to FIG. 4, in operation S130, the memory device 100 (e.g., the bit line sense amplifier BLSA) may perform a second pre-charge operation (pre-charge 2).

The memory device 100 may deactivate the word line WL connected to the memory cell MC where the data has been written.

In some embodiments, in operation S130, the memory device 100 may apply the ground voltage GND to the word line WL connected to the memory cell MC where data is to be written. Since the level of the voltage applied to the gate end of the cell transistor CT is lower than the level of the threshold voltage, the word line WL connected to the memory cell MC may be deactivated.

Referring to the upper part of FIG. 5, in operation S130, the level of the voltage applied to the bit line BL may be the pre-charge voltage VPRE (e.g., 0 V in FIG. 5).

In addition, referring to the upper part of FIG. 5, in operation S130, the level of the voltage applied to the word line WL may be decreased from the first driving voltage (e.g., −VDD+VT) to the ground voltage GND (0 V in FIG. 5). That is, in operation S130, the word line WL may be deactivated.

In addition, referring to the upper part of FIG. 5, in operation S130, the ground voltage GND (0 V in FIG. 5) may be continuously applied to the plate line PL after operations S110 and S120.

At this time, due to the characteristics of the ferroelectric cell capacitor FeCC, although the external voltage level is 0 V, there may exist the cell voltage Vcell. Therefore, in operation S130, when the ground voltage GND is applied to the lower part of the memory cell MC including the ferroelectric cell capacitor FeCC, the cell voltage Vcell 0 corresponding to data "0" may be applied to the upper part of the memory cell MC including the ferroelectric cell capacitor FeCC.

Referring to the hysteresis loop characteristic of the ferroelectric cell capacitor FeCC included in the memory cell MC in the lower part of FIG. 5, the state of the ferroelectric cell capacitor FeCC may be point b described with reference to FIG. 2 since the cell voltage Vcell has a cell voltage level corresponding to data "0".

Hereinafter, an operation of the memory device 100 to read data stored in one memory cell MC is described with reference to FIGS. 6, 7, and 8.

Referring to FIG. 6, in operation S210, the memory device 100 (e.g., the bit line sense amplifier BLSA) may perform a third pre-charge operation (pre-charge 3). The bit line sense amplifier BLSA may pre-charge the bit line BL to be read to the pre-charge voltage VPRE. The level of the pre-charge voltage VPRE may be 0 V. Since the word line WL and the plate line PL are in the deactivated state, the word line WL and the plate line PL may have the level of the ground voltage GND. The ground voltage level may be 0 V.

Referring to the upper part of FIG. 7, the level of the voltage applied to the bit line BL, the word line WL and the plate line PL, each connected to the memory cell MC, is shown over time.

Referring to the upper part of FIG. 7, it may be seen that in operation S210, the bit line BL is pre-charged to 0 V, which is the pre-charge voltage VPRE, and since the word line WL and plate line PL are in a deactivated state, the ground voltage of 0 V is applied thereto.

In addition, referring to the lower part of FIG. 7, the hysteresis loop characteristic of the ferroelectric cell capacitor FeCC included in the memory cell MC is shown.

The initial state of the ferroelectric cell capacitor FeCC may be a state of point e described with reference to FIG. 2 to store data "1" or a state of point b described with reference to FIG. 2 to store data "0".

Referring to FIG. 6, in operation S220, the memory device 100 may perform an operation of reading data from the memory cell MC including the ferroelectric cell capacitor FeCC.

The memory device 100 may activate the word line WL connected to the memory cell MC from which the data is to be read.

In some embodiments, the memory device 100 may apply the first driving voltage to the word line WL connected to the memory cell MC from which data is to be read. For example, the level of the first driving voltage may be any level above VT. The VT may be a threshold voltage of the cell transistor CT.

In operation S220, when the word line WL connected to the memory cell MC is activated, the bit line sense amplifier BLSA may perform a charge sharing operation.

Specifically, since the voltage applied to the bit line BL is pre-charged to the pre-charge voltage VPRE (e.g., 0 V) in operation S110, a part of the charge stored in the ferroelectric cell capacitor FeCC is transferred to the bit line BL connected to the memory cell MC in operation S120, thereby increasing the charge stored in the parasitic capacitor CBL of the bit line BL in the equivalent circuit shown in FIG. 3. That is, the charge-sharing operation may be understood as that the parasitic capacitor CBL shown in FIG. 3 is further connected in parallel to the ferroelectric cell capacitor FeCC to which the cell voltage Vcell is applied.

Therefore, in operation S220, the magnitude of the cell voltage Vcell of the ferroelectric cell capacitor FeCC may decrease, and the degree of decrease may vary depending on the stored data. In addition, the magnitude of the existing cell voltage Vcell may also vary depending on the stored data.

FIG. 8 is a graph of the hysteresis loop linearized with two linear capacitors $C_0$ and $C_1$. $C_0$ represents a capacitance CFeCC 0 of the ferroelectric cell capacitor FeCC having data "0" stored therein, and $C_1$ represents a capacitance CFeCC 1 of the ferroelectric cell capacitor FeCC having data "1" stored therein.

In operation S220, the level of the voltage VCBL applied to the bit line BL may be approximated as follows in Equation 1:

$$VCBL_x =$$

$$\begin{cases} VCBL_1 = \dfrac{CFeCC\,1}{CFeCC\,1 + CBL} * -VCELL\,1 \text{ (if the stored data is a "1")} \\ VCBL_0 = \dfrac{CFeCC\,0}{CFeCC\,0 + CBL} * -VCELL\,0 \text{ (if the stored data is a "0")} \end{cases}$$

<div align="right">Equation 1</div>

VCBLx represents a level of a sense voltage sensed on the bit line BL according to data x, CFeCC 0 represents a capacitance of the ferroelectric cell capacitor FeCC in which data "0" is stored, CFeCC 1 represents a capacitance of the ferroelectric cell capacitor FeCC in which data "1" is stored, CBL represents a total parasitic capacitance of the bit line BL connected to the memory cell MC, VCELL 1 represents a cell voltage Vcell corresponding to data "1" immediately after the write operation, and VCELL 0 represents a cell voltage Vcell corresponding to data "0" immediately after the write operation.

That is, during the read operation, the memory device 100 may read the data stored in the memory cell MC based on the cell voltage Vcell of the ferroelectric cell capacitor FeCC before the word line WL connected to the memory cell MC is activated.

Alternatively, during the read operation, the memory device 100 may read the data stored in the memory cell MC based on the level of the voltage sensed on the bit line BL after the word line WL connected to the memory cell MC is activated. The level of the voltage applied to the bit line BL after the word line WL connected to the memory cell MC is activated may vary depending on the data stored in the memory cell MC.

Hereinafter, a case of reading data "1" stored in the memory cell MC is described first.

After operation S210, in operation S220, the memory device 100 may apply the first driving voltage to the word line WL connected to the memory cell MC from which the data is to be read. For example, the level of the first driving voltage may be any level above VT. The VT may be a threshold voltage of the cell transistor CT.

When reading the data "1" stored in the memory cell MC including the ferroelectric cell capacitor FeCC, the memory device 100 (e.g., bit line sense amplifier BLSA) may read the data by sensing a first sense voltage (e.g., VCBL1) applied to the bit line BL connected to the memory cell MC. The memory device 100 may apply the ground voltage GND to the plate line PL connected to the memory cell MC.

Referring to the upper part of FIG. 7, in operation S220, the level of the voltage sensed on the bit line BL connected to the memory cell MC may be increased from the pre-charge voltage VPRE (e.g., 0 V in FIG. 7) to the first sense voltage (e.g., VCBL1), and may be maintained for a period of time.

The first driving voltage applied to the word line WL may be applied in the form of pulses. Referring to the upper part of FIG. 7, in operation S220 and operation S230 to be described below, the level of the voltage applied to the word line WL may be increased from the ground voltage GND (0 V in FIG. 7) to the first driving voltage, maintained for a certain period of time, and then decreased to the ground voltage GND (0 V in FIG. 7). That is, in operations S220 and S230, the word line WL may continue to be activated after being activated.

In addition, referring to the upper part of FIG. 7, in operation S220, the ground voltage GND (0 V in FIG. 7) may be continuously applied to the plate line PL after operation S210.

When the memory device 100 performs the read operation, the bit line sense amplifier circuitry 161 may compare the level of the reference voltage VREF with the level of the voltage applied to the parasitic capacitor CBL to output the first output voltage VOUT 1 corresponding to "1" which is data stored in the memory cell MC. The voltage applied to the parasitic capacitor CBL may correspond to the first sense voltage (e.g., VCBL1) sensed on the bit line BL connected to the memory cell MC.

In some embodiments, since the level of the voltage applied to the parasitic capacitor CBL (e.g., the first sense voltage (e.g., VCBL1)) is greater than that of the reference voltage VREF, the bit line sense amplifier circuitry 161 may output the first output voltage VOUT 1 corresponding to "1", which is data stored in the memory cell MC.

Referring to FIG. 6, in operation S230, the memory device 100 may perform a rewrite operation.

Specifically, by adjusting the voltage applied to the bit line BL connected to the memory cell MC according to the sensed data, the memory device 100 may restore the ferroelectric cell capacitor FeCC included in the memory cell MC as a charge (e.g., the cell voltage Vcell 1 in operation S210) corresponding to the sensed data.

When the data "1" is rewritten to the memory cell MC including the ferroelectric cell capacitor FeCC, the memory device 100 may apply the second driving voltage VDD to the bit line BL connected to the memory cell MC. In addition, the memory device 100 may apply the ground voltage GND to the plate line PL connected to the memory cell MC. The word line WL may continue to be activated in operation S230 after being activated in the operation S220. That is, following operation S220, in operation S230, the memory device 100 may continuously apply the first driving voltage to the word line WL.

Referring to the upper part of FIG. 7, in operation S230, the level of the voltage applied to the bit line BL may be increased from the first sense voltage (e.g., VCBL1) to the second driving voltage VDD, maintained for a period of time, and then decreased to the pre-charge voltage VPRE (e.g., 0 V in FIG. 7).

Furthermore, referring to the upper part of FIG. 7, in operation S230, the level of the voltage applied to the word line WL may be maintained at the first driving voltage. That is, in operations S220 and S230, the word line WL may continue to be activated after being activated.

In addition, referring to the upper part of FIG. 7, in operation S230, the ground voltage GND (0 V in FIG. 7) may be continuously applied to the plate line PL after operation S220.

As a result, in operation S230, the second driving voltage VDD may be applied to the upper part of the memory cell MC including the ferroelectric cell capacitor FeCC, and the ground voltage GND may be applied to the lower part of the memory cell MC including the ferroelectric cell capacitor FeCC. As shown in FIG. 3, the cell voltage Vcell may have the −VDD level according to the voltage convention based on the node where the lower part of the ferroelectric cell capacitor FeCC and the plate line PL are connected. It is assumed that the magnitude of VDD is greater than that of Vmax described with reference to FIG. 2.

Referring to the hysteresis loop characteristic of the ferroelectric cell capacitor FeCC included in the memory cell MC in the lower part of FIG. 7, the state of the ferroelectric cell capacitor FeCC may be point d described with reference to FIG. 2 because the cell voltage Vcell has the −VDD level.

Referring to FIG. 6, in operation S240, the memory device 100 (e.g., the bit line sense amplifier BLSA) may perform a fourth pre-charge operation (pre-charge 4).

The memory device 100 may deactivate the word line WL connected to the memory cell MC where the data has been rewritten.

In some embodiments, in operation S240, the memory device 100 may apply the ground voltage GND to the word line WL connected to the memory cell MC from which the data is to be read. Since the level of the voltage applied to the gate end of the cell transistor CT is lower than the level of the threshold voltage, the word line WL connected to the memory cell MC may be deactivated.

Referring to the upper part of FIG. 7, in operation S240, the level of the voltage applied to the bit line BL may be the pre-charge voltage VPRE (e.g., 0 V in FIG. 7).

In addition, referring to the upper part of FIG. 7, in operation S240, the level of the voltage applied to the word line WL may be decreased from the first driving voltage to the ground voltage GND (0 V in FIG. 7). That is, in operation S240, the word line WL may be deactivated.

In addition, referring to the upper part of FIG. 7, in operation S240, the ground voltage GND (0 V in FIG. 7) may be continuously applied to the plate line PL after operations S210, S220, and S230.

At this time, due to the characteristics of the ferroelectric cell capacitor FeCC, although the external voltage level is 0 V, there may exist the cell voltage Vcell. Therefore, in operation S240, when the ground voltage GND is applied to the lower part of the memory cell MC including the ferroelectric cell capacitor FeCC, the cell voltage Vcell 1 corresponding to data "1" may be applied to the upper part of the memory cell MC including the ferroelectric cell capacitor FeCC.

Referring to the hysteresis loop characteristic of the ferroelectric cell capacitor FeCC included in the memory cell MC in the lower part of FIG. 7, since the cell voltage Vcell has a cell voltage level corresponding to data "1", the state of the ferroelectric cell capacitor FeCC may be point e described with reference to FIG. 2.

Hereinafter, a case of reading data "0" stored in the memory cell MC is described. After operation S210, in operation S220, the memory device 100 may apply the first driving voltage to the word line WL connected to the memory cell MC from which the data is to be read. For example, the level of the first driving voltage may be any level above VT. The VT may be a threshold voltage of the cell transistor CT.

When reading the data "0" stored in the memory cell MC including the ferroelectric cell capacitor FeCC, the memory device 100 (e.g., bit line sense amplifier BLSA) may read the data by sensing the second sense voltage (e.g., VCBL0) applied to the bit line BL connected to the memory cell MC.

The memory device 100 may apply the ground voltage GND to the plate line PL connected to the memory cell MC.

Referring to the upper part of FIG. 7, in operation S220, the level of the voltage sensed on the bit line BL connected to the memory cell MC may be decreased from the pre-charge voltage VPRE (e.g., 0 V in FIG. 7) to the second sense voltage (e.g., VCBL0) and may be maintained for a period of time.

The first driving voltage applied to the word line WL may be applied in the form of pulses. Referring to the upper part of FIG. 7, in operation S220 and operation S230 to be described below, the level of the voltage applied to the word line WL may be increased from the ground voltage GND (0 V in FIG. 7) to the first driving voltage, maintained for a certain period of time, and then decreased to the ground voltage GND (0 V in FIG. 7). That is, in operations S220 and S230, the word line WL may continue to be activated after being activated.

In addition, referring to the upper part of FIG. 7, in operation S220, the ground voltage GND (0 V in FIG. 7) may be continuously applied to the plate line PL after operation S210.

When the memory device 100 performs the read operation, the bit line sense amplifier circuitry 161 may compare the level of the reference voltage VREF with the level of the voltage applied to the parasitic capacitor CBL to output the second output voltage VOUT 0 corresponding to "0", which is data stored in the memory cell MC. The voltage applied to the parasitic capacitor CBL may correspond to the second sense voltage (e.g., VCBL0) sensed on the bit line BL connected to the memory cell MC.

In some embodiments, the bit line sense amplifier circuitry 161 may output the second output voltage VOUT 0 corresponding to "0", which is data stored in the memory cell MC, because the level of the voltage applied to the parasitic capacitor CBL (e.g., the second sense voltage (e.g., VCBL0)) is lower than that of the reference voltage VREF.

Referring to FIG. 6, in operation S230, the memory device 100 may perform a rewrite operation.

Specifically, by adjusting the voltage applied to the bit line BL connected to the memory cell MC according to the sensed data, the memory device 100 may restore the ferroelectric cell capacitor FeCC included in the memory cell MC as a charge (e.g., the cell voltage Vcell 1 in operation S210) corresponding to the sensed data.

When the data "0" is rewritten into the memory cell MC including the ferroelectric cell capacitor FeCC, the memory device 100 may apply the third driving voltage −VDD to the bit line BL connected to the memory cell MC.

The second driving voltage +VDD applied to the bit line BL when the data "1" is rewritten and the third driving voltage −VDD applied to the bit line BL when the data "0" is rewritten may have the same voltage magnitude but have opposite voltage directions. That is, the third driving voltage −VDD may be a reverse voltage −VDD of the second driving voltage VDD, which has the same magnitude as the second drive voltage VDD.

In addition, the memory device 100 may apply the ground voltage GND to the plate line PL connected to the memory cell MC. The word line WL may continue to be activated in operation S230 after being activated in operation S220. That is, following operation S220, in operation S230, the memory device 100 may continuously apply the first driving voltage to the word line WL.

Referring to the upper part of FIG. 7, in operation S230, the level of the voltage applied to the bit line BL may be decreased from the second sense voltage (e.g., VCBL0) to the second driving voltage VDD, maintained for a certain period of time, and then increased to the pre-charge voltage VPRE (e.g., 0 V in FIG. 7).

Furthermore, referring to the upper part of FIG. 7, in operation S230, the level of the voltage applied to the word line WL may be maintained at the first driving voltage. That is, in operations S220 and S230, the word line WL may continue to be activated after being activated.

In addition, referring to the upper part of FIG. 7, in operation S230, the ground voltage GND (0 V in FIG. 7) may be continuously applied to the plate line PL after operation S220.

As a result, in operation S230, the third driving voltage −VDD may be applied to the upper part of the memory cell MC including the ferroelectric cell capacitor FeCC, and the ground voltage GND may be applied to the lower part of the memory cell MC including the ferroelectric cell capacitor FeCC. As shown in FIG. 3, the cell voltage Vcell may have the +VDD level according to the voltage convention based on the node where the lower part of the ferroelectric cell capacitor FeCC and the plate line PL are connected. It is assumed that the magnitude of VDD is greater than that of Vmax described with reference to FIG. 2.

Referring to the hysteresis loop characteristic of the ferroelectric cell capacitor FeCC included in the memory cell MC in the lower part of FIG. 7, the state of the ferroelectric cell capacitor FeCC may be point a described with reference to FIG. 2 because the cell voltage Vcell has the +VDD level.

Referring to FIG. 6, in operation S240, the memory device 100 (e.g., the bit line sense amplifier BLSA) may perform a fourth pre-charge operation (pre-charge 4).

The memory device 100 may deactivate the word line WL connected to the memory cell MC where the data has been rewritten.

In some embodiments, in operation S240, the memory device 100 may apply the ground voltage GND to the word line WL connected to the memory cell MC from which the data is to be read. Since the level of the voltage applied to the gate end of the cell transistor CT is lower than the level of the threshold voltage, the word line WL connected to the memory cell MC may be deactivated.

Referring to the upper part of FIG. 7, in operation S240, the level of the voltage applied to the bit line BL may be the pre-charge voltage VPRE (e.g., 0 V in FIG. 7).

In addition, referring to the upper part of FIG. 7, in operation S240, the level of the voltage applied to the word line WL may be decreased from the first driving voltage to the ground voltage GND (0 V in FIG. 7). That is, in operation S240, the word line WL may be deactivated.

In addition, referring to the upper part of FIG. 7, in operation S240, the ground voltage GND (0 V in FIG. 7) may be continuously applied to the plate line PL after operations S210, S220, and S230.

At this time, due to the characteristics of the ferroelectric cell capacitor FeCC, although the external voltage level is 0 V, there may exist the cell voltage Vcell. Therefore, in operation S240, when the ground voltage GND is applied to the lower part of the memory cell MC including the ferroelectric cell capacitor FeCC, the cell voltage Vcell 0 corresponding to data "0" may be applied to the upper part of the memory cell MC including the ferroelectric cell capacitor FeCC.

Referring to the hysteresis loop characteristic of the ferroelectric cell capacitor FeCC included in the memory cell MC in the lower part of FIG. 7, the state of the ferroelectric cell capacitor FeCC may be point b described with reference to FIG. 2 since the cell voltage Vcell has a cell voltage level corresponding to data "0".

Figure 9:
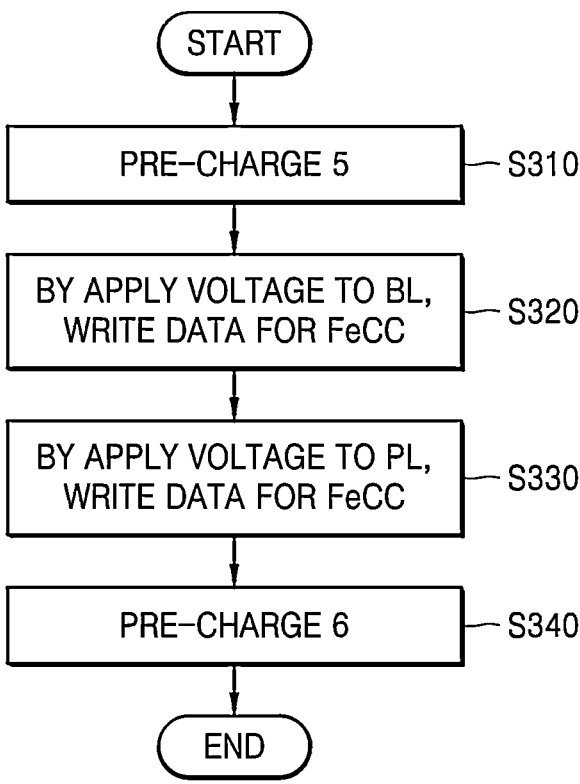
FIG. 9 is a flowchart of a write operation of a memory device according to a comparative example.
Figure 10:
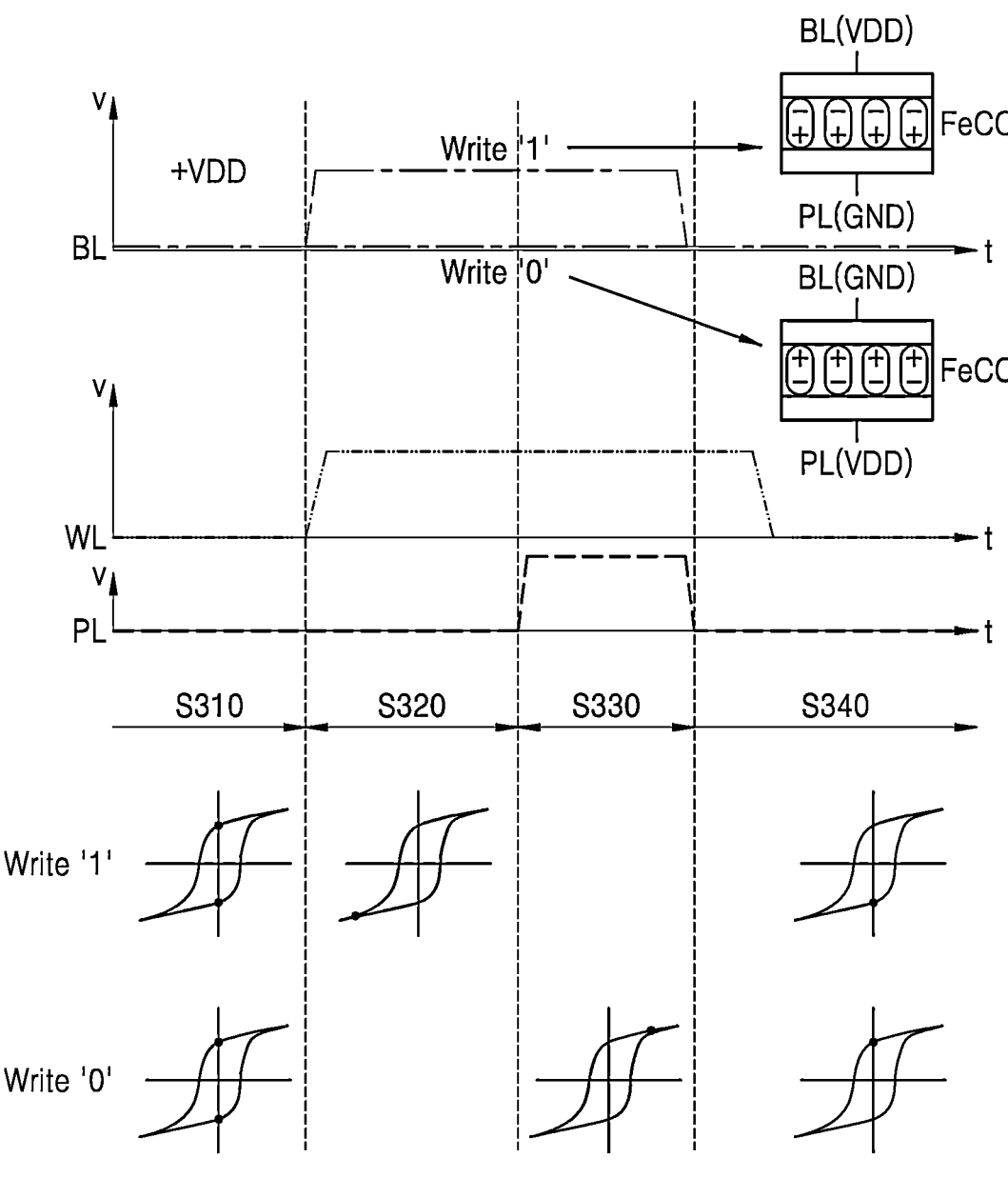
FIG. 10 is a diagram for explaining a write operation of a memory device according to a comparative example.
Figure 11:
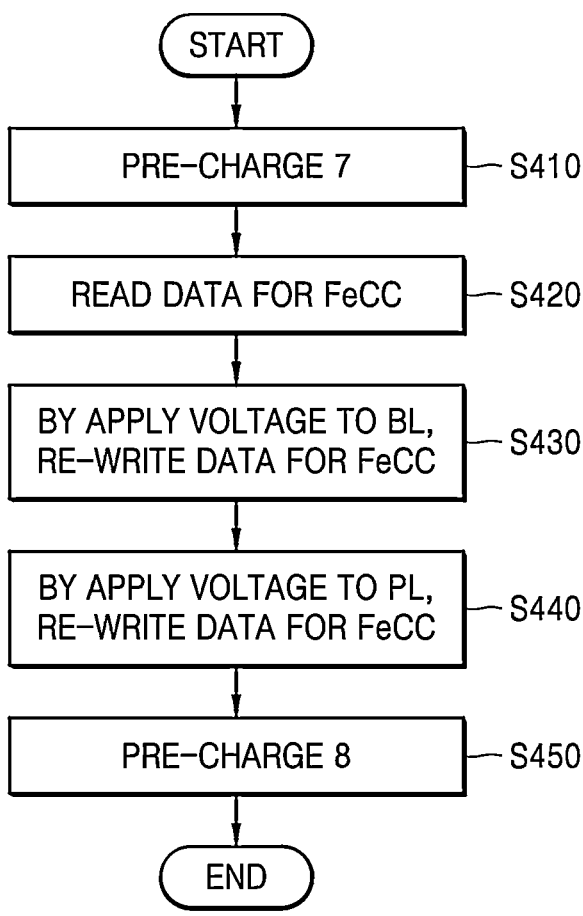
FIG. 11 is a flowchart of a read operation of a memory device according to a comparative example.
Figure 12:
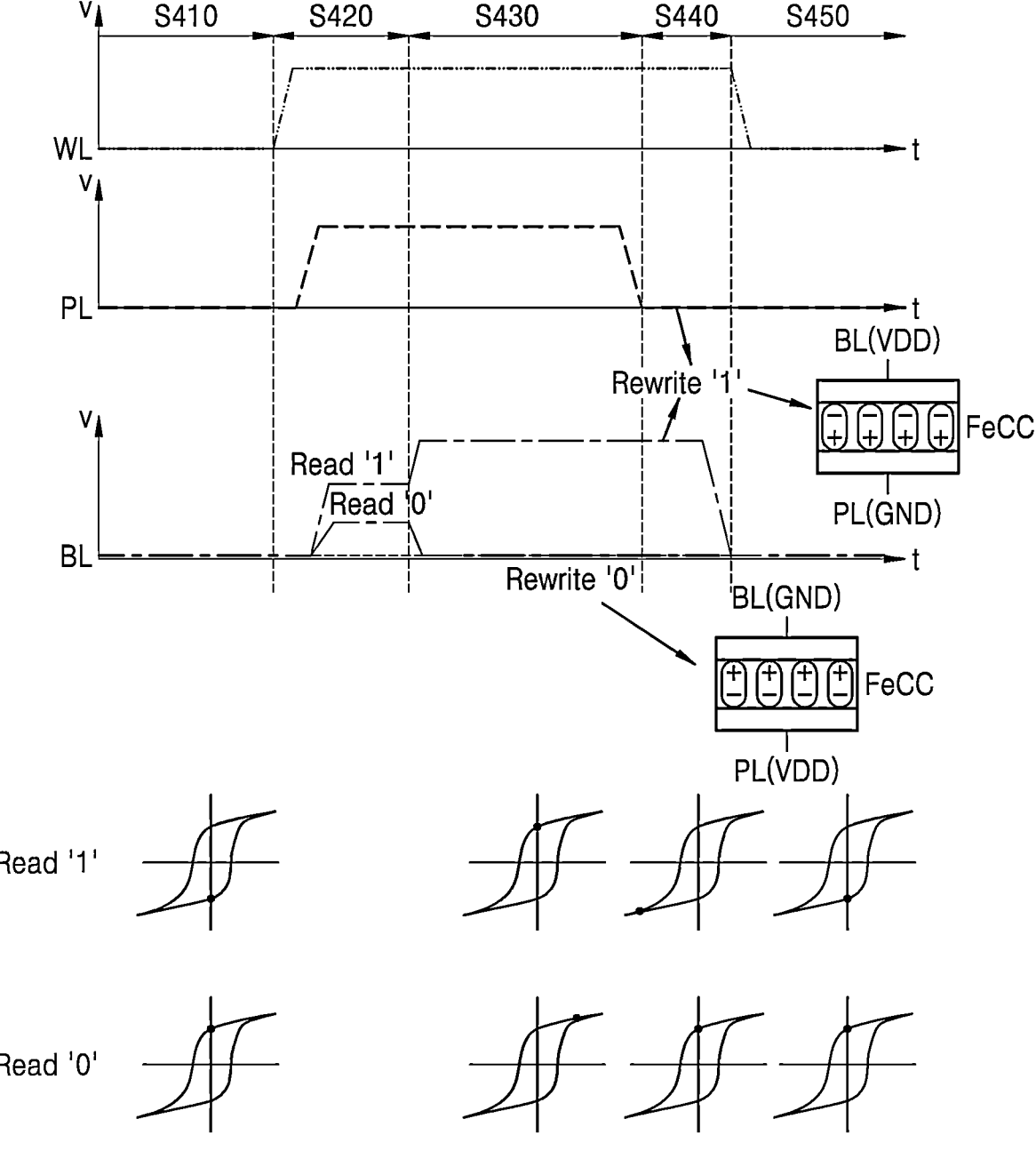
FIG. 12 is a diagram for explaining a read operation of a memory device according to a comparative example.

FIG. 9 is a flowchart of a write operation of a memory device according to a comparative example. FIG. 10 is a diagram for explaining a write operation of a memory device according to a comparative example. FIG. 11 is a flowchart of a read operation of a memory device according to a comparative example. FIG. 12 is a diagram for explaining a read operation of a memory device according to a comparative example.

Hereinafter, a write operation of the memory device 100 according to a comparative example is described with reference to FIG. 9 and FIG. 10.

Referring to FIG. 9, in operation S310, the memory device 100 performs a fifth pre-charge operation (pre-charge 5). Referring to FIG. 10, it may be seen that the bit line BL is pre-charged to the pre-charge voltage VPRE, and the ground voltage GND is applied to the word line WL and the plate line PL.

Hereinafter, a case of writing data "1" into the memory cell MC is described.

After operation S310, in operation S320, the memory device 100 applies a fourth driving voltage to the word line WL connected to the memory cell MC where data is to be written, and the memory device 100 applies a fifth driving voltage +VDD to the bit line BL connected to the memory cell MC where data is to be written. Referring to the lower part of FIG. 10, the state of the ferroelectric cell capacitor FeCC corresponds to point d described with reference to FIG. 2.

Referring to FIG. 9, in operation S330, the memory device 100 applies a sixth driving voltage to the plate line PL connected to the memory cell MC where data is to be written, and pre-charges the bit line BL to the pre-charge voltage VPRE. Referring to FIG. 10, the sixth driving voltage applied to the plate line PL is applied in the form of pulses to the plate line PL in operation S330.

Referring to FIG. 9, in operation S340, the memory device 100 performs a sixth pre-charge operation (pre-charge 6). By applying the ground voltage GND to the word line WL, the word line WL is deactivated.

Since the method of writing data "0" into the memory cell MC is similar to the method of writing data "1" into the memory cell MC described above, description thereof is omitted here in the interest of brevity.

Hereinafter, the read operation of the memory device 100 according to the comparative example is described below with reference to FIGS. 11 and 12.

Referring to FIG. 11, in operation S410, the memory device 100 performs the fifth pre-charge operation (pre-charge 5). Referring to FIG. 12, it may be seen that the bit line BL is pre-charged to the pre-charge voltage VPRE, and the ground voltage GND is applied to the word line WL and the plate line PL.

Hereinafter, a case of reading data "1" stored in the memory cell MC is described.

Referring to FIG. 11, after operation S410, in operation S420, the memory device 100 activates the word line WL and the plate line PL, each connected to the memory cell MC, and the bit line sense amplifier BLSA performs a charge sharing operation. The memory device 100 applies the fourth driving voltage to the word line WL connected to the memory cell MC where data is to be read, and applies the sixth driving voltage to the plate line PL connected to the memory cell MC where data is to be read.

Referring to FIG. 12, in operation S420, the memory device 100 reads the data stored in the memory cell MC based on the level of the voltage sensed on the bit line BL after the word line WL connected to the memory cell MC is activated.

Referring to FIG. 11, in operation S430, the memory device 100 applies the fifth driving voltage +VDD to the bit line BL connected to the memory cell MC where data is to be rewritten. Referring to the lower part of FIG. 12, the state of the ferroelectric cell capacitor FeCC corresponds to point b described with reference to FIG. 2.

In addition, after the sixth driving voltage is applied to the plate line PL for a certain period of time, operation S440 in FIG. 11 is started while applying the ground voltage GND to the plate line PL.

Referring to the lower part of FIG. 12, the state of the ferroelectric cell capacitor FeCC in operation S440 corresponds to point d described with reference to FIG. 2.

In addition, after the fifth driving voltage +VDD is applied to the bit line BL for a certain period of time in operation S440, operation S450 in FIG. 11 is started while applying the pre-charge voltage VPRE to the bit line BL.

Referring to FIG. 11, in operation S450, the memory device 100 performs an eighth pre-charge operation (pre-charge 8). By applying the ground voltage GND to the word line WL, the word line WL is deactivated. Referring to the lower part of FIG. 12, the state of the ferroelectric cell capacitor FeCC in operation S450 corresponds to point e described with reference to FIG. 2.

Figure 13A:
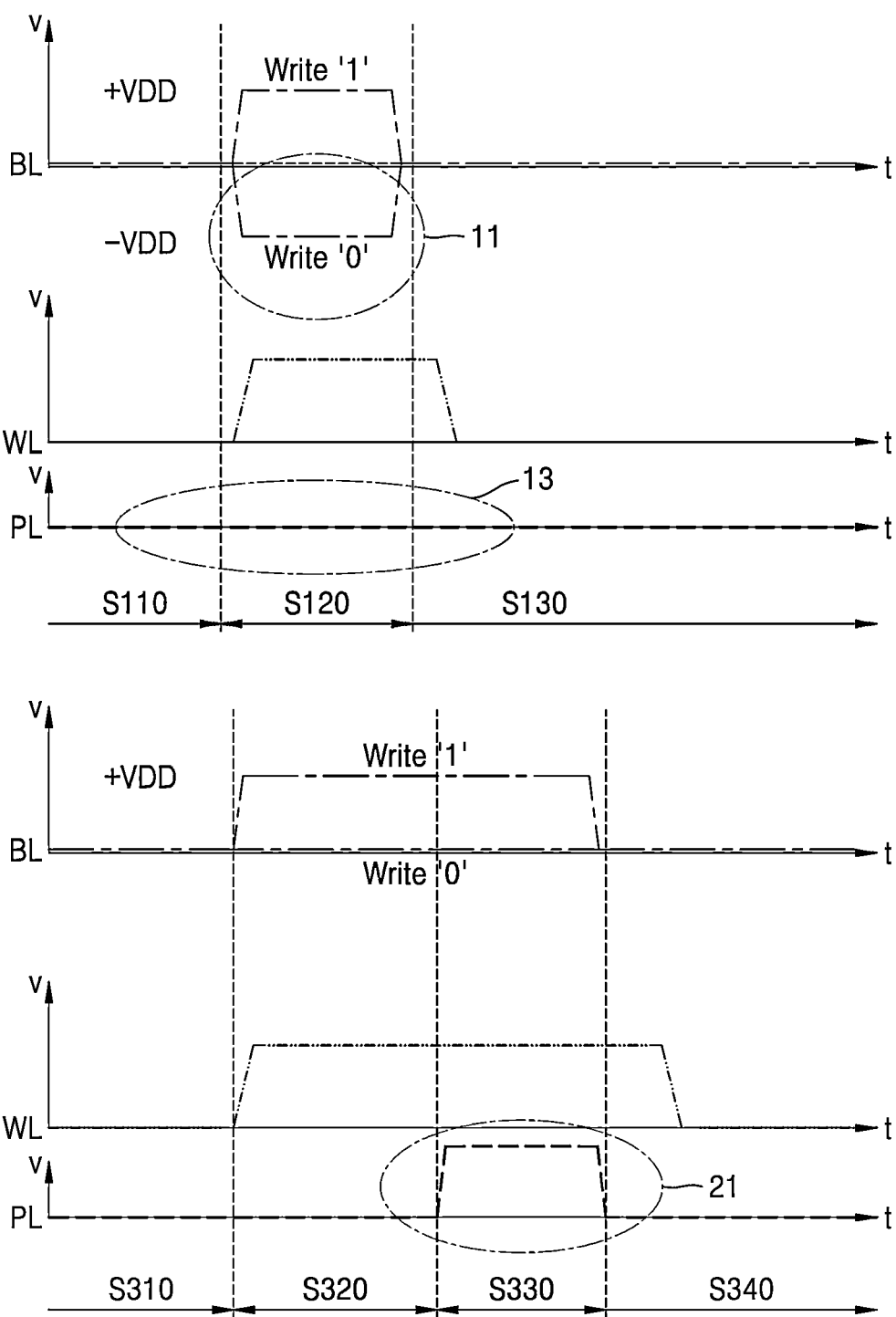
FIGS. 13A and 13B are diagrams for comparing and explaining an operation of a memory device according to some embodiments and an operation of a memory device according to a comparative example.
Figure 13B:
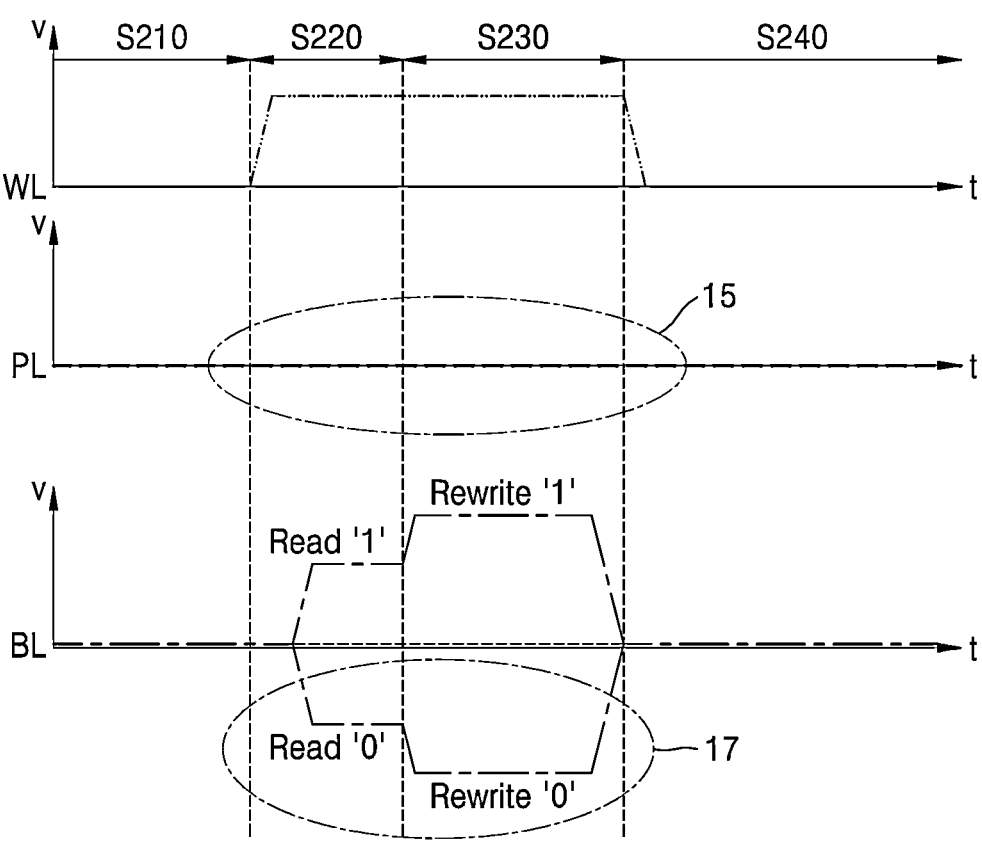
Figure 13B:
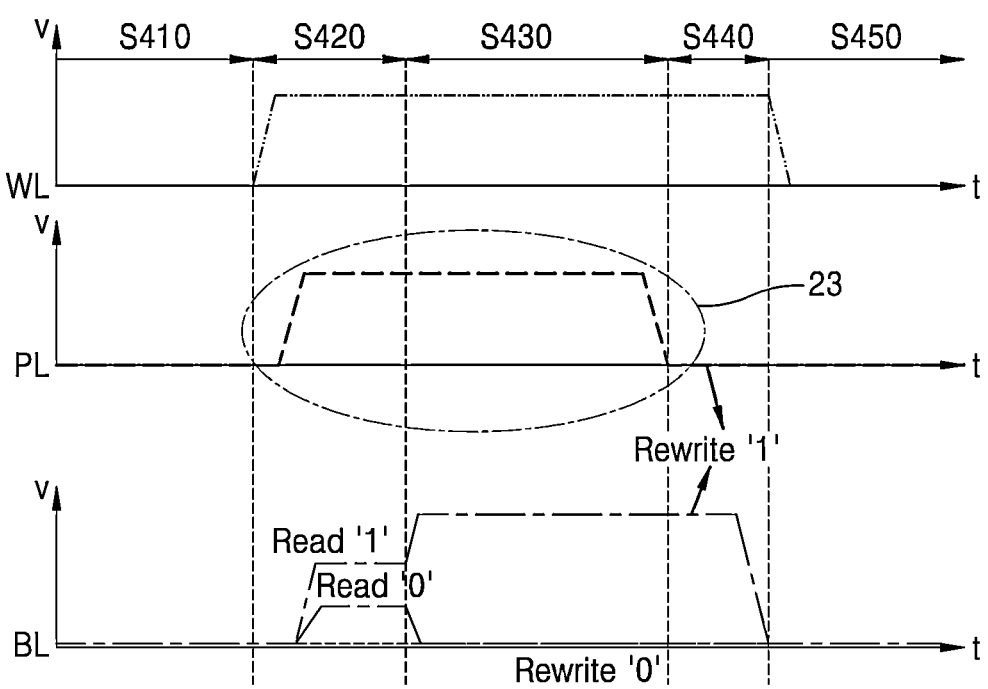

FIGS. 13A and 13B are diagrams for comparing and explaining an operation of a memory device according to some embodiments and an operation of a memory device according to a comparative example.

Referring to the upper part of FIG. 13A, the level of the voltage applied to or sensed on the bit line BL, the word line WL, and the plate line PL over time during the write operation of the memory device according to some embodiments and described with reference to FIG. 5 is shown, and referring to the lower part of FIG. 13A, the level of the voltage applied to or sensed on the bit line BL, the word line WL, and the plate line PL over time during the write operation of the memory device according to a comparative example described with reference to FIG. 10 is shown.

Referring to the upper part of FIG. 13B, the level of the voltage applied to or sensed on the bit line BL, the word line WL, and the plate line PL over time during the read operation of the memory device according to some embodiments and described with reference to FIG. 7 is shown, and referring to the lower part of FIG. 13B, the level of the voltage applied to or sensed on the bit line BL, the word line WL, and the plate line PL over time during the read operation of the memory device according to a comparative example described with reference to FIG. 12 is shown.

Compared with the write/read operation of the memory device according to a comparative example, the ground voltage GND may be continuously applied to the plate line PL during the write/read operation of the memory device according to some embodiments.

Referring to the lower parts of FIGS. 13A and 13B, a voltage 21 applied to the plate line PL in the form of a pulse in operation S330 during the write operation of the memory device according to a comparative example and a voltage 23 applied to the plate line PL in the form of a pulse through operations S420 and S430 during the read operation of the memory device according to a comparative example are essential for the write or read operation of the memory device according to a comparative example.

On the other hand, referring to the upper part of FIG. 13A, the voltage 13 continuously applied to the plate line PL through operations S110, S120, and S130 during the write operation of the memory device according to some embodiments may be the ground voltage GND. As the memory device according to an embodiment applies the third driving voltage −VDD 11 in the form of a pulse to the bit line BL when writing data "0" into the ferroelectric cell capacitor FeCC, the voltage 13 continuously applied to the plate line PL through operations S110, S120, and S130 during the write operation of the memory device may be the ground voltage GND. The second driving voltage +VDD applied to the bit line BL when the data "1" is written and the third driving voltage −VDD applied to the bit line BL when the data "0" is written have the same voltage magnitude but have opposite voltage directions. That is, the third driving voltage −VDD may be a reverse voltage −VDD of the second driving voltage VDD, which has the same magnitude as the second drive voltage VDD.

In addition, referring to the upper part of FIG. 13B, the voltage 15 continuously applied to the plate line PL in operations S210, S220, S230, and S240 during the read operation of the memory device according to some embodiments may be the ground voltage GND. As the memory device according to some embodiments applies the third driving voltage −VDD 17 in the form of a pulse to the bit line BL when reading and rewriting data "0" from the ferroelectric cell capacitor FeCC, the voltage 15 applied to the plate line PL through operations S210, S220, S230, and S240 during the write operation of the memory device may be the ground voltage GND. The second driving voltage +VDD applied to the bit line BL when the data "1" is written and the third driving voltage −VDD applied to the bit line BL when the data "0" is written have the same voltage magnitude but have opposite voltage directions. That is, the third driving voltage −VDD may be a reverse voltage −VDD of the second driving voltage VDD, which has the same magnitude as the second drive voltage VDD.

Therefore, the plate line decoder (or plate line voltage generator) that applies a voltage to the plate line PL during the write or read operation of the memory device according to a comparative example must be implemented essentially, but the plate line decoder (or plate line voltage generator) that applies a voltage to the plate PL during the write or read operation of the memory device according to some embodiments does not necessarily have to be implemented.

That is, the memory device according to some embodiments may perform the write or read operation with only the word line decoder and the bit line decoder without the plate line decoder.

As a result, the memory device according to some embodiments may reduce the resources for the area previously occupied by the plate line decoder, thereby increasing the efficiency of the area available for design during circuit design. This is described in greater detail with reference to FIGS. 14A to 15B.

In addition, according to the memory device according to some embodiments, latency may be improved because there is no need to consider skew margin for the output signal of the plate line decoder, which was considered when designing the existing plate line decoder.

In addition, since the voltages 21 and 23 applied to the plate line PL in the form of pulses are necessarily required during the write or read operation of the memory device according to a comparative example, the write and read operation had to be performed sequentially in the order of writing data "1" and then writing data "0" or writing data "0" and then writing data "1" when the plate line PL is commonly connected to the plurality of ferroelectric cell capacitors FeCC. That is, the memory device in which the plate line PL is commonly connected to the plurality of ferroelectric cell capacitors FeCC had to perform write or read operations sequentially for each data.

However, during the write or read operation of the memory device according to some embodiments, since the voltages 13 and 15 applied to the plate line PL are continuously applied as the ground voltage GND, even when the plate line PL commonly connects the plurality of ferroelectric cell capacitors FeCC, data "1" and data "0" may be simultaneously written into or read from the plurality of ferroelectric cell capacitors FeCC by adjusting only the voltage applied to the word line WL and the bit line BL.

In some embodiments, by applying the ground voltage GND to the plate line PL commonly connecting the plurality of ferroelectric cell capacitors FeCC, the memory device according to some embodiments may activate a first word line WL, may write data "1" into a first ferroelectric cell capacitor FeCC connected to the first word line WL based on the driving voltage +VDD or −VDD applied to the bit line BL, and may simultaneously write data "0" to a second ferroelectric cell capacitor FeCC connected to the first word line WL.

That is, by adjusting the output voltages of the first and second bit line decoders, the memory device may write first data to the first ferroelectric cell capacitor and second data to the second ferroelectric cell capacitor at the same time.

Figure 14A:
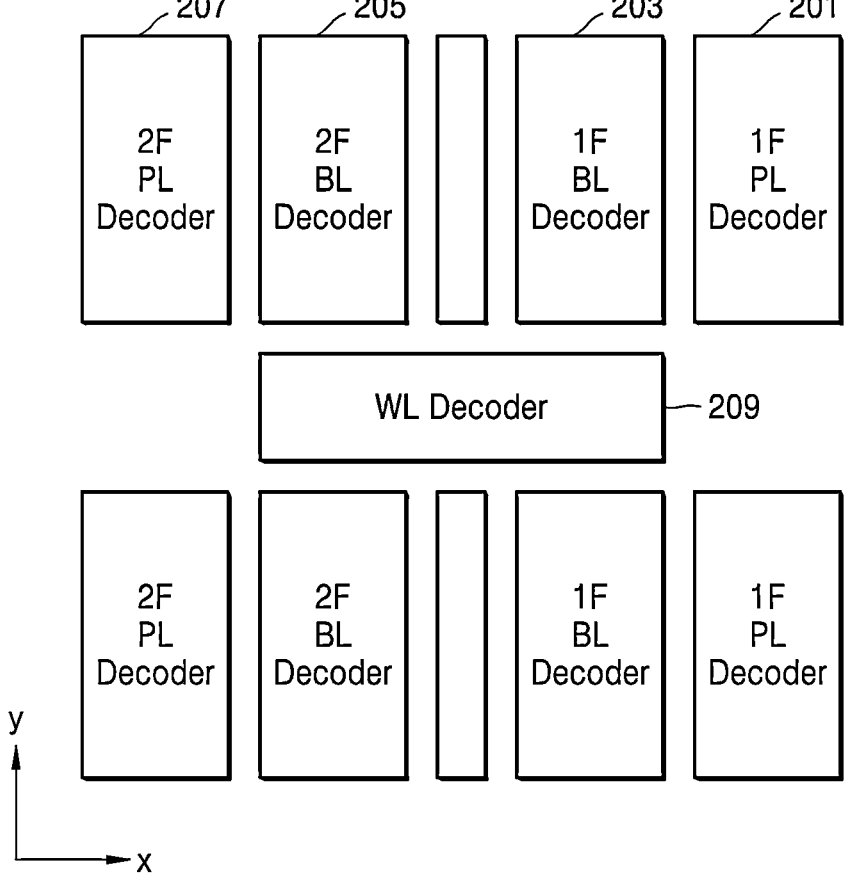
FIGS. 14A and 14B are diagrams for explaining a layout of a memory device according to a comparative example.
Figure 14B:
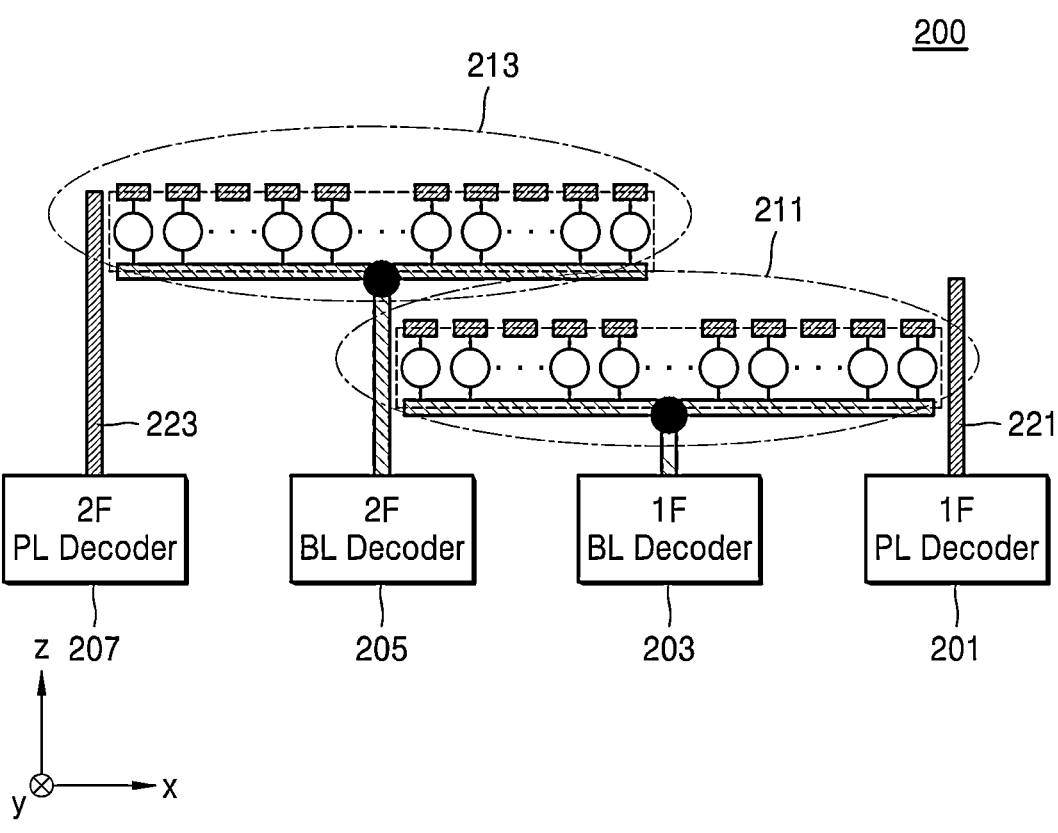
Figure 15A:
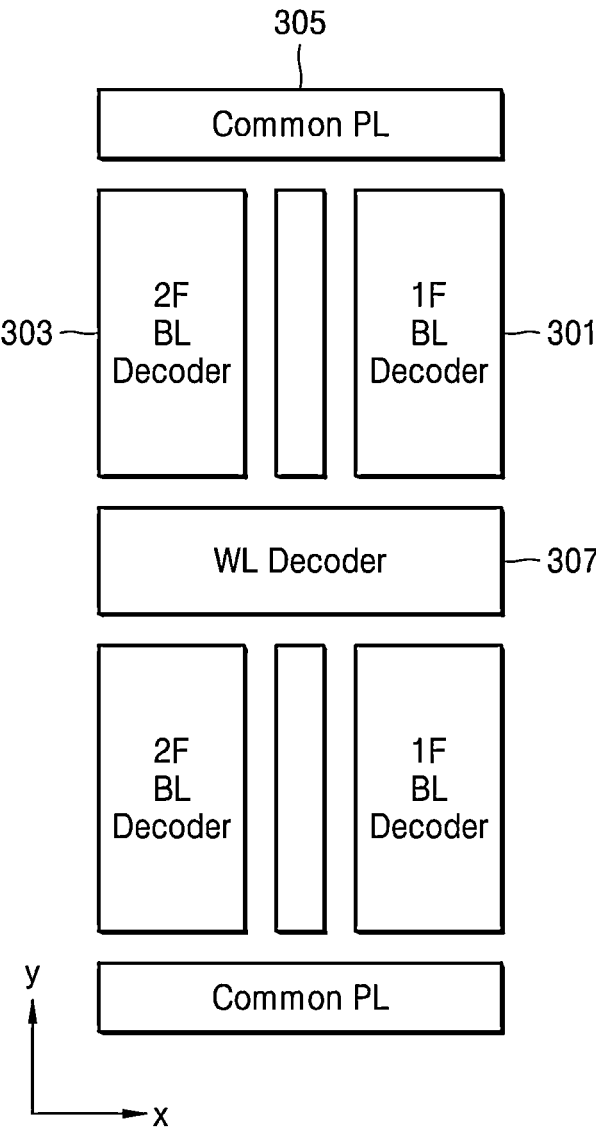
FIGS. 15A and 15B are diagrams for explaining a layout of a memory device according to some embodiments.
Figure 15B:
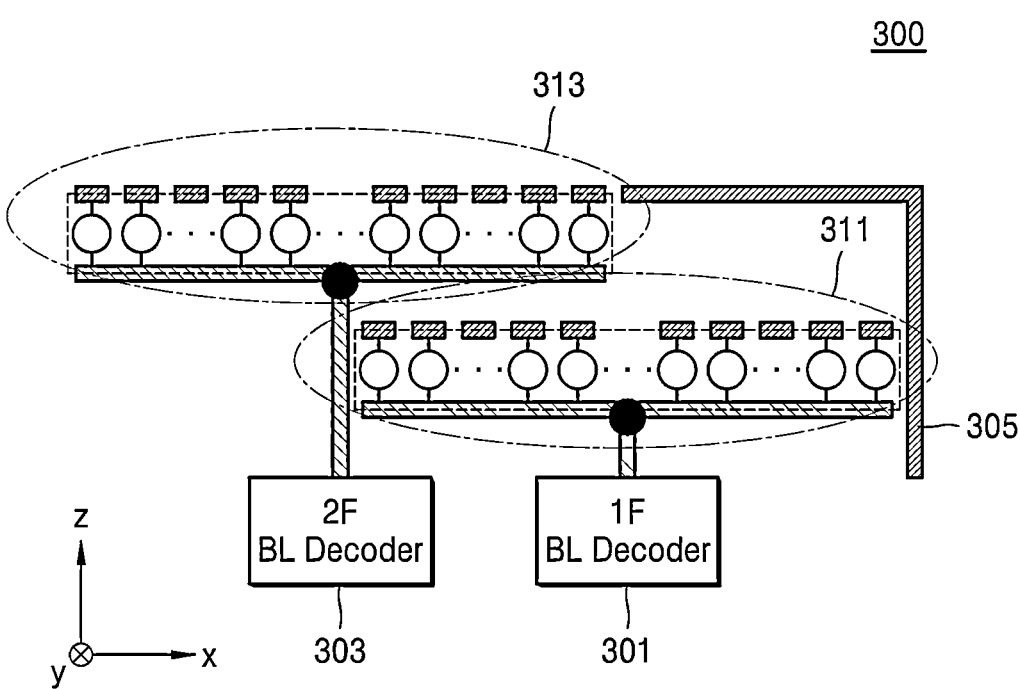

FIGS. 14A and 14B are diagrams for explaining a layout of a memory device according to a comparative example. FIGS. 15A and 15B are diagrams for explaining a layout of a memory device according to some embodiments.

FIG. 14A is a layout illustrating a horizontal cross-section of a memory device 200 according to a comparative example, and FIG. 14B is a layout illustrating a vertical cross-section of the memory device 200 according to a comparative example. FIG. 15A is a layout illustrating a horizontal cross-section of a memory device 300 according to some embodiments, and FIG. 15B is a layout illustrating a vertical cross-section of the memory device 300 according to some embodiments.

Referring to FIG. 14A, the memory device 200 according to a comparative example may include a first plate line decoder 201 connected to a first layer 211, a first bit line decoder 203 connected to the first layer 211, a second bit line decoder 205 connected to a second layer 213, a second plate line decoder 207 connected to the second layer 213, and a word line decoder 209. The word line decoder 209 may be connected to the first layer 211 and the second layer 213. In addition, the above configurations may be implemented as a tile structure on a wafer substrate.

Referring to FIG. 14B, the first layer 211 and the second layer 213 may include a plurality of ferroelectric cell capacitors FeCC. A lower part of the ferroelectric cell capacitor FeCC included in the first layer 211 may be connected to the first bit line decoder 203, and an upper part of the ferroelectric cell capacitor FeCC included in the first layer 211 may be connected to the first plate line decoder 201 through a first plate line 221. A lower part of the ferroelectric cell capacitor FeCC included in the second layer 213 may be connected to the second bit line decoder 205, and an upper part of the ferroelectric cell capacitor FeCC included in the second layer 213 may be connected to the second plate line decoder 207 through a second plate line 223.

Referring to FIG. 15A, the memory device 300 according to some embodiments may include a first bit line decoder 301 connected to a first layer 311, a second bit line decoder 303 connected to a second layer 313, a common plate line 305 connected to the first layer 311 and the second layer 313, and a word line decoder 307. The word line decoder 307 may be connected to the first layer 311 and the second layer 313. In addition, the above configurations may be implemented as a tile structure on a wafer substrate.

Referring to FIG. 15B, the first layer 311 and the second layer 313 may include a plurality of ferroelectric cell capacitors FeCC. A lower part of the ferroelectric cell capacitor FeCC included in the first layer 311 may be connected to the first bit line decoder 301, a lower part of the ferroelectric cell capacitor FeCC included in the second layer 313 may be connected to the second bit line decoder 303, and upper parts of the ferroelectric cell capacitor FeCC included in the first layer 311 and an upper part of the ferroelectric cell capacitor FeCC included in the second layer 313 may be connected to the common plate line 305. That is, the upper part of the ferroelectric cell capacitor FeCC may be connected to the common plate line 305 regardless of layers, such as whether it is the first layer or the second layer.

That is, although the memory device 200 according to a comparative example of FIG. 14 necessarily includes the plate line decoders 201 and 207 to perform the write operation in FIG. 9 and the read operation in FIG. 11, the memory device 300 according to some embodiments of FIGS. 15A and 15B may perform the write operation of FIG. 4 and the read operation of FIG. 6 using the common plate line 305 to which the ground voltage is applied. That is, the memory device 300 according to some embodiments may perform the write operation of FIG. 4 and the read operation of FIG. 6 using only the common plate line 305 without the plate line decoders 201 and 207.

As a result, the memory device according to some embodiments may reduce the resources for the area previously occupied by the plate line decoder, thereby increasing the efficiency of the area available for design during circuit design.

While the inventive concept has been particularly shown and described with reference to some examples of embodiments thereof, it will be understood that various changes in form and details may be made therein without departing from the spirit and scope of the following claims.

What is claimed is:

1. An operating method of a memory device, the method comprising:
   pre-charging a bit line to a pre-charge voltage, the bit line connected to a ferroelectric cell capacitor to be written to;
   writing data into the ferroelectric cell capacitor by adjusting a level of a voltage applied to the bit line and to a word line corresponding to the ferroelectric cell capacitor; and
   deactivating the word line,
   wherein a voltage applied to a plate line connected to the ferroelectric cell capacitor is maintained at a ground voltage during the writing of the data into the ferroelectric cell capacitor.

2. The method of claim 1, wherein the writing of the data comprises applying a first driving voltage to the word line.

3. The method of claim 1, wherein the writing of the data comprises:
   when writing first data to the ferroelectric cell capacitor, applying a second driving voltage to the bit line; and
   when writing second data to the ferroelectric cell capacitor, applying a third driving voltage to the bit line.

4. The method of claim 3,
   wherein the second driving voltage is a positive voltage, and the third driving voltage is a negative voltage.

5. The method of claim 3, wherein the third driving voltage is a reverse voltage of the second driving voltage, which has an equal magnitude to the second driving voltage but has an opposite sign to the second driving voltage.

6. An operating method of a memory device, the method comprising:

pre-charging a bit line to a pre-charge voltage, the bit line connected to a ferroelectric cell capacitor to be read;

reading data stored in the ferroelectric cell capacitor by performing a charge sharing operation;

rewriting the data into the ferroelectric cell capacitor by adjusting a level of a voltage applied to the bit line; and deactivating a word line corresponding to the ferroelectric cell capacitor, wherein a voltage applied to a plate line connected to the ferroelectric cell capacitor is maintained at a ground voltage during the reading of the data stored in the ferroelectric cell capacitor.

7. The method of claim 6, wherein the rewriting of the data comprises applying a first driving voltage to the word line.

8. The method of claim 6, wherein the reading of the data comprises:

when reading first data from the ferroelectric cell capacitor in which the first data is stored, sensing a first sense voltage on the bit line; and when reading second data from the ferroelectric cell capacitor in which the second data is stored, sensing a second sense voltage on the bit line.

9. The method of claim 8, wherein the first sense voltage is a positive voltage, and the second sense voltage is a negative voltage.

10. The method of claim 6, wherein the rewriting of the data comprises:

when first data is read from the ferroelectric cell capacitor in which the first data is stored, applying a second driving voltage to the bit line; and when second data is read from the ferroelectric cell capacitor in which the second data is stored, applying a third driving voltage to the bit line.

11. The method of claim 10, wherein the second driving voltage is a positive voltage, and the third driving voltage is a negative voltage.

12. The method of claim 10, wherein the third driving voltage is a reverse voltage of the second driving voltage, which has the same magnitude as the second driving voltage but has an opposite sign to the second driving voltage.

13. A memory device comprising:

a memory cell array including a first layer including a plurality of first ferroelectric cell capacitors and a second layer including a plurality of second ferroelectric cell capacitors;

a first bit line decoder connected to the first layer;

a second bit line decoder connected to the second layer;

a common plate line connected to the first layer and the second layer; and a word line decoder connected to the first layer and the second layer, wherein the memory device is configured to apply a voltage to the common plate line that is maintained at a ground voltage when a write operation or a read operation is performed on the memory cell array.

14. The memory device of claim 13, further comprising control circuitry that is configured to write first data to a first ferroelectric cell capacitor of the plurality of first ferroelectric cell capacitors and write second data to a second ferroelectric cell capacitor of the plurality of second ferroelectric cell capacitors by adjusting output voltages of the first bit line decoder and the second bit line decoder.

15. The memory device of claim 13, further comprising control circuitry, wherein the control circuitry is configured to:

output a first signal to the first bit line decoder configured to cause pre-charging of a bit line to a pre-charge voltage, the bit line connected to a first ferroelectric cell capacitor of the plurality of first ferroelectric cell capacitors, the first ferroelectric cell capacitor to be written, output a second signal that is configured to cause the first bit line decoder to adjust of a level of a voltage applied to the bit line connected to the first ferroelectric cell capacitor, and output a third signal that is configured to cause the word line decoder to adjust a level of a voltage applied to a word line connected to the first ferroelectric cell capacitor, thereby allowing data to be written into the first ferroelectric cell capacitor, and output a fourth signal that is configured to cause the word line decoder to deactivate the word line.

16. The memory device of claim 15, wherein the control circuitry is configured to:

apply a second driving voltage to the bit line when writing first data to the first ferroelectric cell capacitor, and apply a third driving voltage to the bit line when writing second data to the first ferroelectric cell capacitor.

17. The memory device of claim 16, wherein the second driving voltage is a positive voltage, and the third driving voltage is a negative voltage.

18. The memory device of claim 16, wherein the third driving voltage is a reverse voltage of the second driving voltage, which has the same magnitude as the second driving voltage.

19. The memory device of claim 13, further comprising a bit line sense amplifier and control circuitry, wherein the control circuitry is configured to:

output a first signal configured to cause the first bit line decoder to pre-charge a bit line to a pre-charge voltage, the bit line connected to a first ferroelectric cell capacitor of the plurality of first ferroelectric cell capacitors, the first ferroelectric cell capacitor to be read, read data stored in the first ferroelectric cell capacitor by causing the bit line sense amplifier to perform a charge sharing operation, output a second signal configured to cause the first bit line decoder to adjust a level of a voltage applied to the bit line connected to the first ferroelectric cell capacitor, thereby allowing the data to be rewritten into the first ferroelectric cell capacitor, and output a third signal configured to cause the word line decoder to deactivate a word line corresponding to the first ferroelectric cell capacitor.

20. The memory device of claim 19, wherein the control circuitry, which allows the data to be rewritten, is configured to:

when first data is read from the first ferroelectric cell capacitor in which the first data is stored, apply a second driving voltage to the bit line; and when second data is read from the first ferroelectric cell capacitor in which the second data is stored, apply a third driving voltage to the bit line, wherein the third driving voltage is a reverse voltage of the second driving voltage, which has an equal magnitude to the second driving voltage but has an opposite sign to the second driving voltage.

* * * * *